(12) United States Patent
Ikeda et al.

(10) Patent No.: US 8,969,988 B2
(45) Date of Patent: Mar. 3, 2015

(54) SOLID-STATE IMAGING DEVICE, METHOD OF MANUFACTURING SOLID-STATE IMAGING DEVICE, AND ELECTRONIC DEVICE

(71) Applicant: Sony Corporation, Tokyo (JP)

(72) Inventors: Harumi Ikeda, Kanagawa (JP); Yasushi Tateshita, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/934,642

(22) Filed: Jul. 3, 2013

(65) Prior Publication Data
US 2014/0015085 A1 Jan. 16, 2014

(30) Foreign Application Priority Data

Jul. 12, 2012 (JP) .................... 2012-156899

(51) Int. Cl.
*H01L 31/0232* (2014.01)
*H04N 5/232* (2006.01)

(52) U.S. Cl.
CPC .......... *H01L 31/02325* (2013.01); *H04N 5/232* (2013.01)
USPC ...................... 257/432; 257/E31.127; 438/70

(58) Field of Classification Search
USPC ........................ 257/432, E31.127; 438/70, 73
See application file for complete search history.

(56) References Cited

U.S. PATENT DOCUMENTS

| 2006/0187381 | A1* | 8/2006 | Yokozawa | 349/106 |
|---|---|---|---|---|
| 2008/0260298 | A1* | 10/2008 | Kamon | 382/321 |
| 2009/0230492 | A1* | 9/2009 | Yamamoto | 257/432 |
| 2012/0147208 | A1* | 6/2012 | Otsuka et al. | 348/222.1 |
| 2012/0273907 | A1* | 11/2012 | Lim | 257/432 |
| 2012/0280346 | A1* | 11/2012 | Hung et al. | 257/432 |

FOREIGN PATENT DOCUMENTS

JP 2011-003860 A 6/2011

* cited by examiner

*Primary Examiner* — Phuc Dang
(74) *Attorney, Agent, or Firm* — Sheridan Ross P.C.

(57) ABSTRACT

There is provided a solid-state imaging device including a semiconductor substrate, pixels each including a photoelectric conversion unit formed in the semiconductor substrate, a trench that is formed in the semiconductor substrate and separates the pixels that are adjacent, and a color filter that is formed above the photoelectric conversion unit of each of the pixels and buried in at least a part of the trench.

19 Claims, 26 Drawing Sheets

FIG. 24
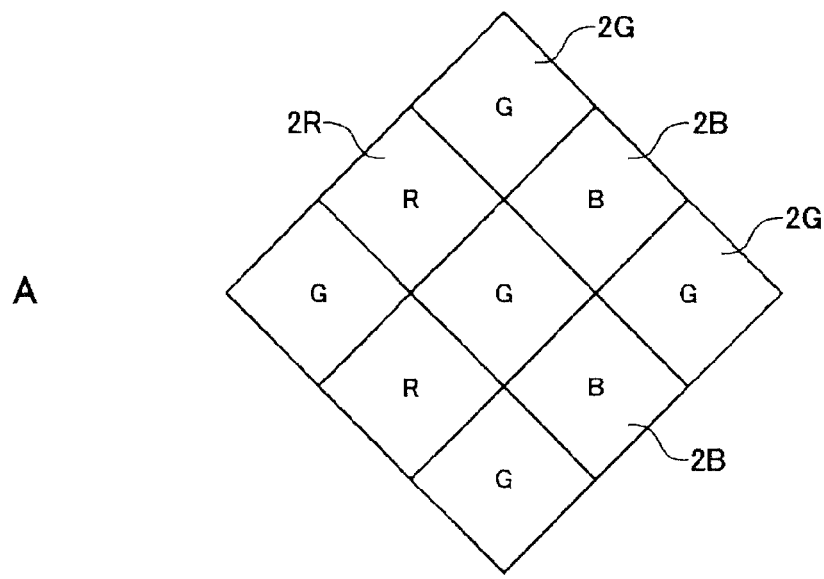
A
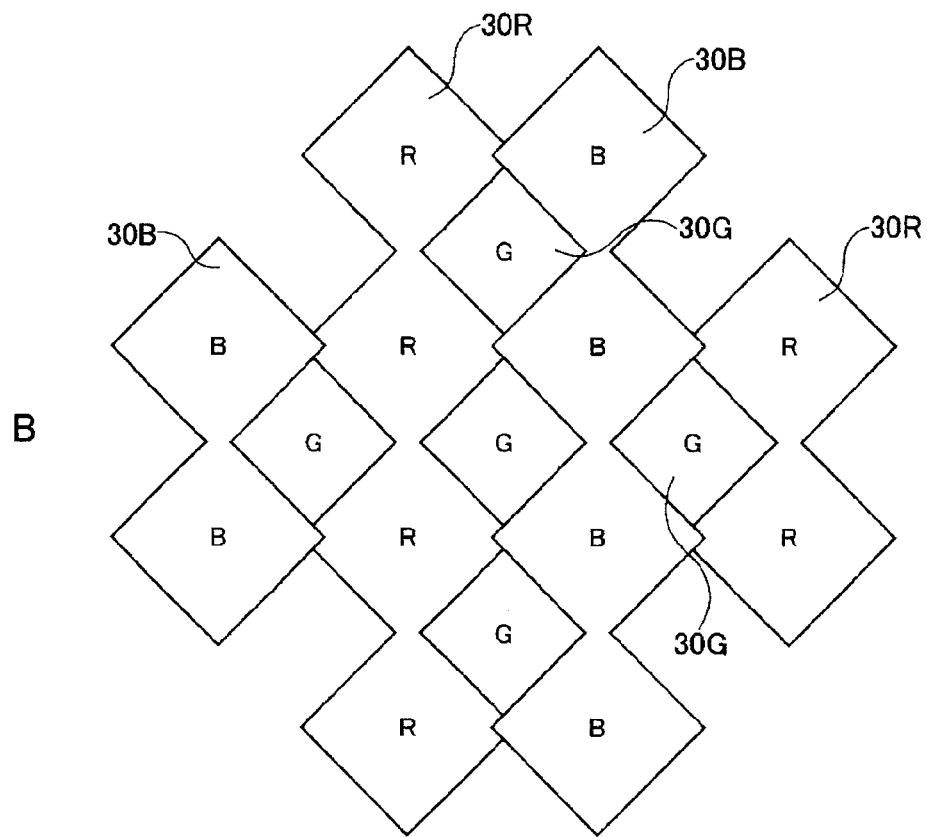
B

FIG. 25
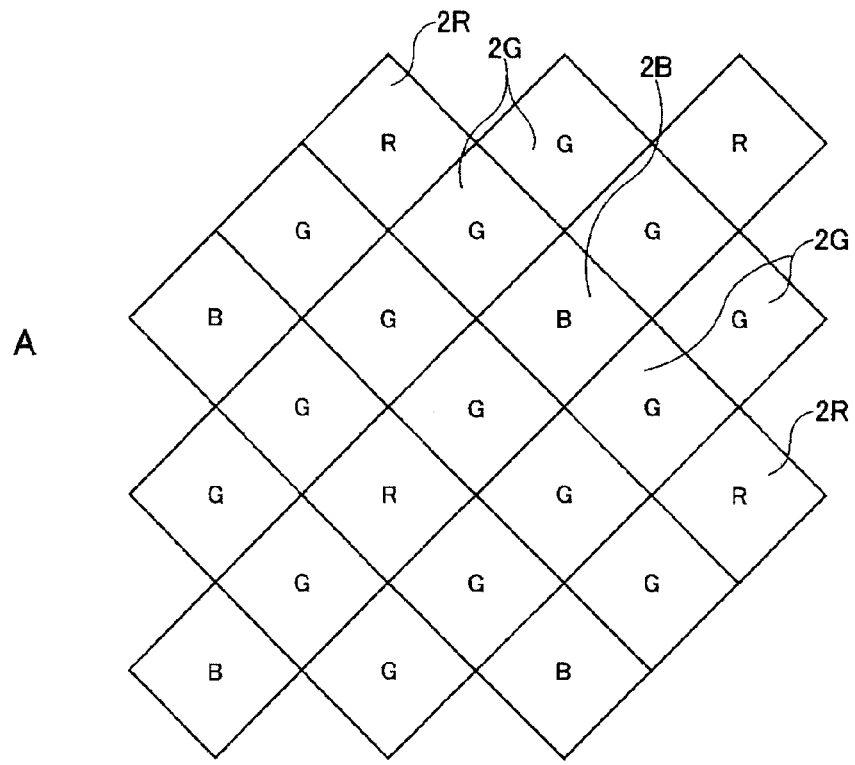
A
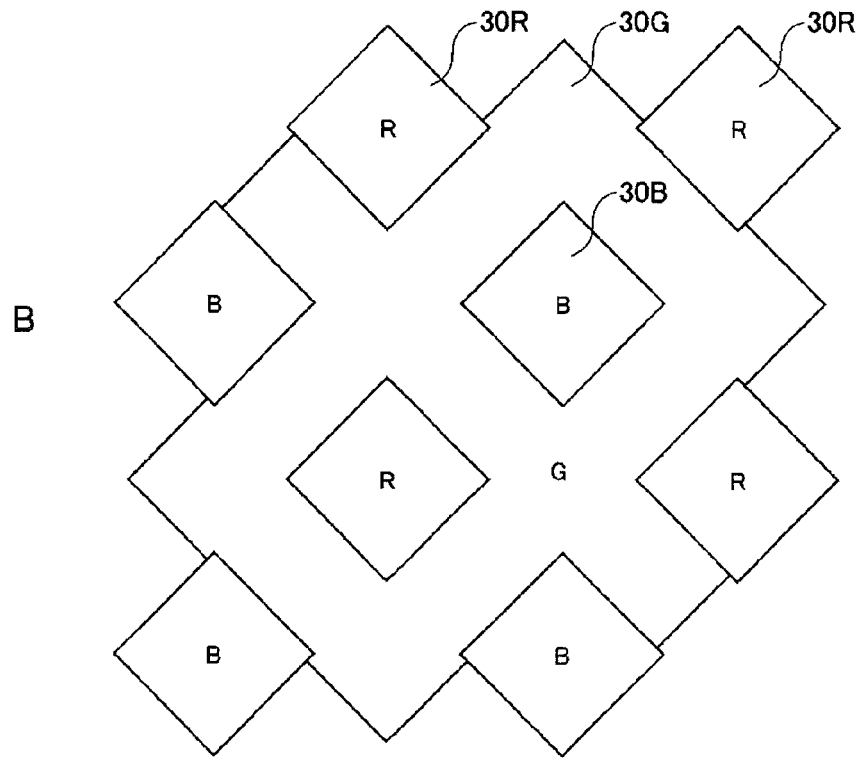
B

FIG. 26
A
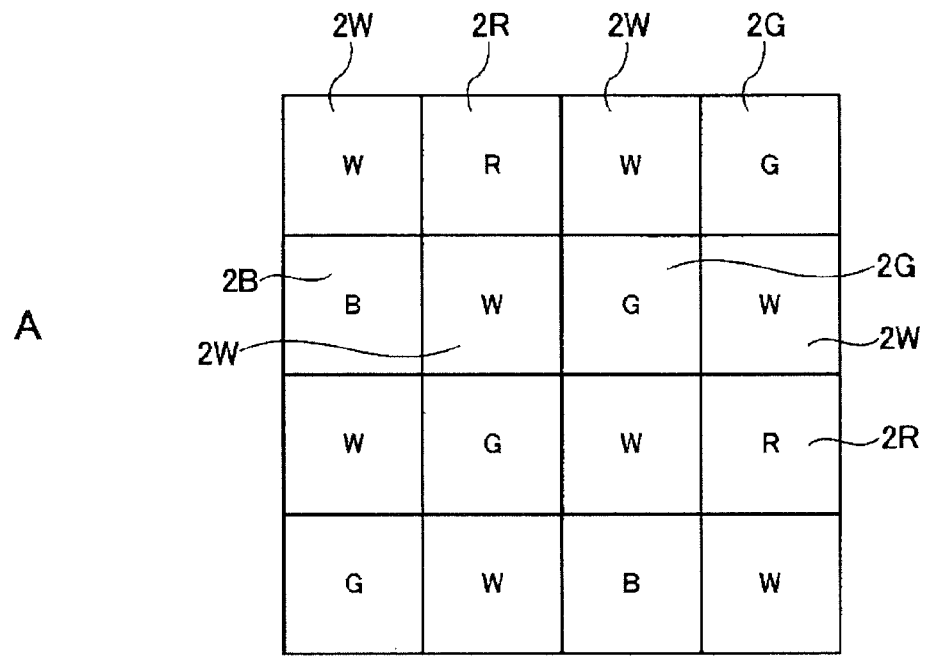
B
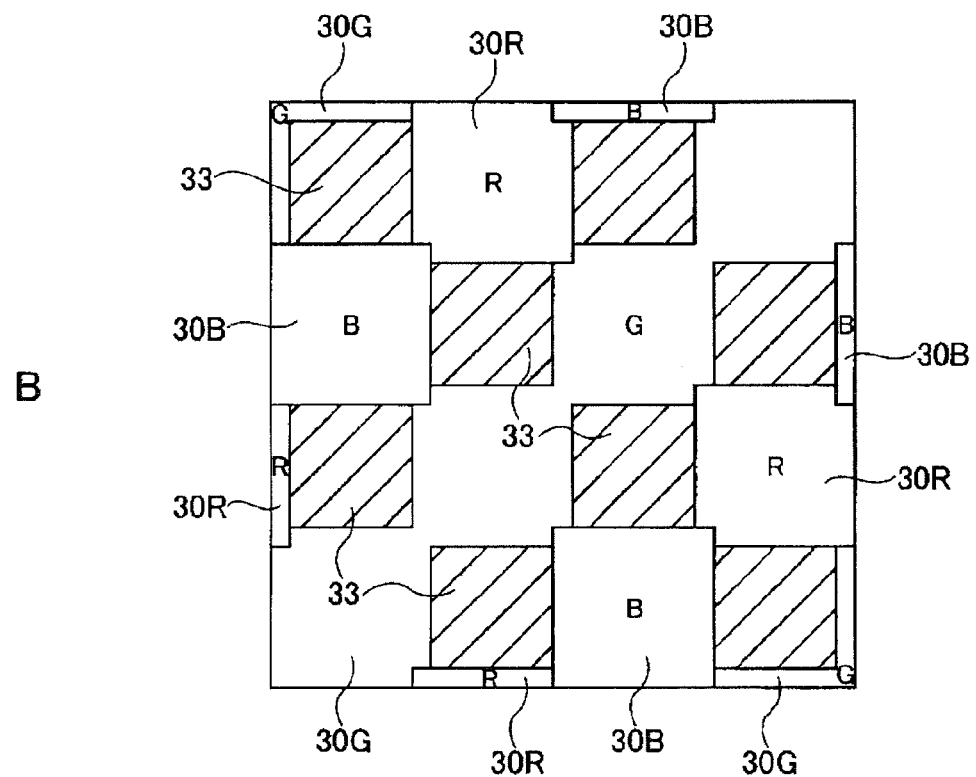

FIG. 27
A
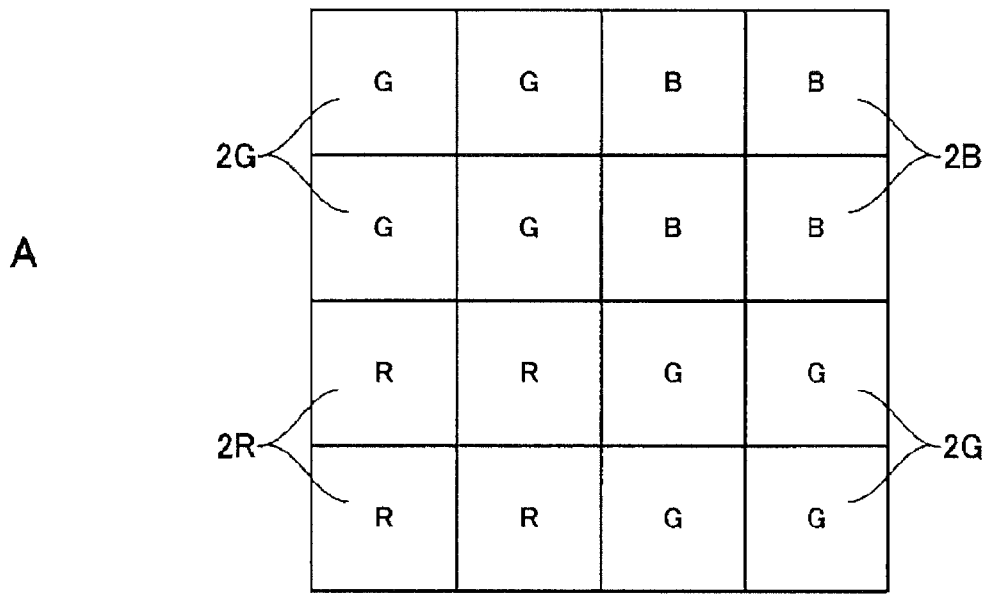
B
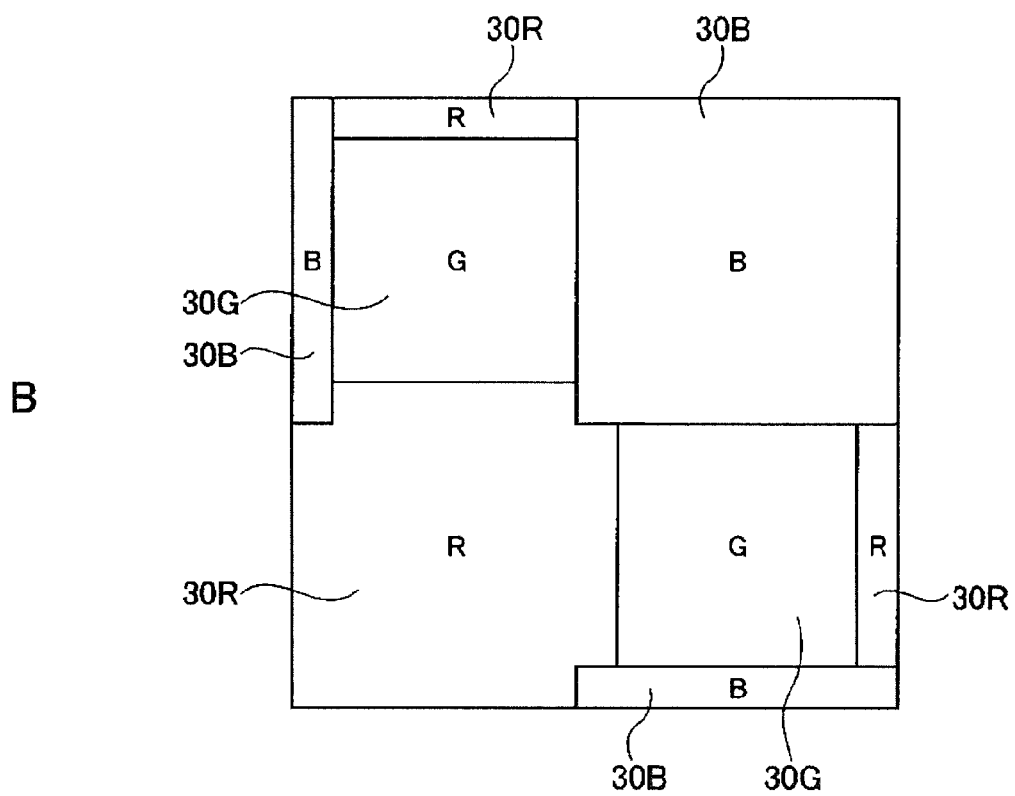

SOLID-STATE IMAGING DEVICE, METHOD OF MANUFACTURING SOLID-STATE IMAGING DEVICE, AND ELECTRONIC DEVICE

BACKGROUND

The present technology relates to a solid-state imaging device and a method of manufacturing the solid-state imaging device. Further, the present technology relates to an electronic device including a solid-state imaging device.

In solid-state imaging devices, there are cases in which light or charges of a pixel filter into an adjacent pixel, causing a so-called color mixture. In order to suppress the color mixture, configurations in which a trench is formed between pixels to physically separate pixels from each other, and a light blocking material such as metal is buried in the trench have been suggested (for example, see JP 2011-3860 A).

SUMMARY

When a light blocking material is buried in a trench formed between pixels, a color mixture with an adjacent pixel is suppressed by the light blocking material, but the sensitivity deteriorates due to reflection or absorption. Particularly, light incident on the top surface of the trench in which the light blocking material is buried is reflected or absorbed by the light blocking material and is not incident on a pixel, and thus the sensitivity deteriorates accordingly.

It is desirable to provide a solid-state imaging device and a method of the manufacturing the solid-state imaging device, which are capable of improving the sensitivity while suppressing the color mixture. Further, it is desirable to provide an electronic device including the solid-state imaging device.

According to an embodiment of the present technology, there is provided a solid-state imaging device including a semiconductor substrate, pixels each including a photoelectric conversion unit formed in the semiconductor substrate, a trench that is formed in the semiconductor substrate and separates the pixels that are adjacent, and a color filter that is formed above the photoelectric conversion unit of each of the pixels and buried in at least a part of the trench.

According to an embodiment of the present technology, there is provided a method of manufacturing a solid-state imaging device, including forming a photoelectric conversion unit included in pixels in a semiconductor substrate, forming a trench separating the pixels that are adjacent in the semiconductor substrate, and forming a color filter above the photoelectric conversion unit of each of the pixels, and burying the color filter in at least a part of the trench.

An electronic device according to the embodiment of the present technology includes an optical system, a solid-state imaging device, and a signal processing circuit that processes an output signal of the solid-state imaging device, and has a configuration in which the solid-state imaging device is the solid-state imaging device according to the embodiment of the present technology.

According to the configuration of the solid-state imaging device according to the embodiment of the present technology, a color filter is formed to be buried in at least a part of a trench separating adjacent pixels from each other. As a result, through the color filter buried in the trench, light can be prevented from filtering into an adjacent pixel, and the occurrence of the color mixture can be suppressed. Further, since a light blocking material such as a metal is not used in the trench, loss of sensitivity caused by reflection or absorption can be suppressed.

According to the method of manufacturing the solid-state imaging device according to the embodiment of the present technology, since a color filter is formed to be buried in at least a part of a trench, light can be prevented from filtering into an adjacent pixel, and the occurrence of the color mixture can be suppressed. Further, since the color filter is formed above the photoelectric conversion unit of the pixel and the color filter is formed to be buried in at least a part of the trench, the color filter can be simultaneously formed above the photoelectric conversion unit of the pixel and in the trench.

According to the configuration of the electronic device according to the embodiment of the present technology, since the electronic device includes the solid-state imaging device according to the embodiment of the present technology, the occurrence of the color mixture can be suppressed, and loss of the sensitivity can be suppressed in the solid-state imaging device.

According to the embodiments of the present disclosure described above, since the occurrence of the color mixture can be suppressed and loss of the sensitivity can be suppressed, the sensitivity can be improved while suppressing the color mixture.

Further, according to the method of manufacturing the solid-state imaging device of the embodiment of the present technology, since a color filter can be simultaneously formed above a photoelectric conversion unit of a pixel and in a trench, the number of processes can be reduced compared to the case in which a light blocking material or the like is buried in a trench separately from a color filter.

BRIEF DESCRIPTION OF THE DRAWINGS

FIGS. 24A and 24B are diagrams illustrating a color array of pixels and a color filter array in a solid-state imaging device according to a third embodiment;

FIGS. 25A and 25B are diagrams illustrating a color array of pixels and a color filter array in a solid-state imaging device according to a fourth embodiment;

FIGS. 26A and 26B are diagrams illustrating a color array of pixels and a color filter array in a solid-state imaging device according to a fifth embodiment;

FIGS. 27A and 27B are diagrams illustrating a color array of pixels and a color filter array in a solid-state imaging device according to a sixth embodiment;

DETAILED DESCRIPTION OF THE EMBODIMENT(S)

Figure 1:
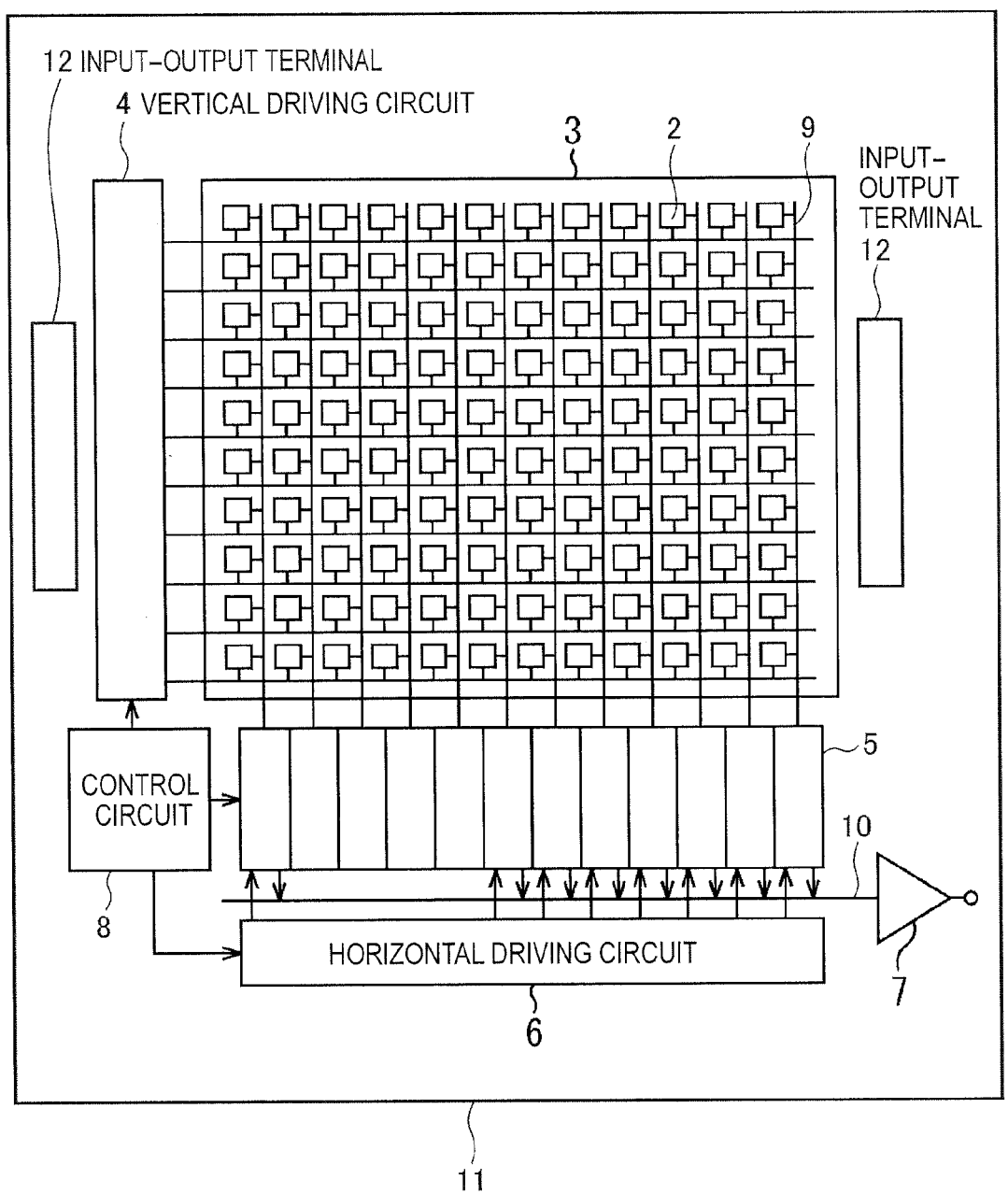
FIG. 1 is a schematic configuration diagram (plane view) illustrating a solid-state imaging device according to a first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, best modes (hereinafter referred to as "embodiments") for carrying out the present technology will be described. The description will proceed in the following order.

1. First embodiment (solid-state imaging device)
2. Second embodiment (solid-state imaging device)
3. Third embodiment (solid-state imaging device)
4. Fourth embodiment (solid-state imaging device)
5. Fifth embodiment (solid-state imaging device)
6. Sixth embodiment (solid-state imaging device)
7. Modified example of solid-state imaging device
8. Seventh embodiment (electronic device)

<1. First Embodiment (Solid-state Imaging Device)>

FIG. 1 illustrates a schematic configuration diagram of a solid-state imaging device according to a first embodiment. The present embodiment relates to an example in which the present technology is applied to a CMOS type solid-state imaging device (a CMOS image sensor).

A solid-state imaging device 1 according to the present embodiment is configured with a solid-state imaging element configured such that a pixel unit 3 in which many pixels 2 each including a photoelectric conversion unit are two-dimensionally arranged in a regular manner and a peripheral circuit unit including a driving circuit and the like are formed on a semiconductor substrate 11 such as a silicon substrate as illustrated in FIG. 1.

The pixel 2 includes a photoelectric conversion unit and a pixel transistor configured with a MOS transistor. As the pixel transistor, for example, at least one of a transfer transistor, a reset transistor, an amplifying transistor, and a selecting transistor is provided.

The peripheral circuit unit is configured to include a vertical driving circuit 4, a column signal processing circuit 5, a horizontal driving circuit 6, an output circuit 7, a control circuit 8, and the like.

For example, the vertical driving circuit 4 is configured with a register, and selects a pixel driving line, supplies a pulse to drive pixels to the selected pixel driving line, and drives pixels in units of rows. In other words, the vertical driving circuit 4 sequentially selectively scans the pixels 2 of the pixel unit 3 in the vertical direction in units of rows, and supplies a pixel signal based on a signal charge generated according to a quantity of received light in each pixel 2 to the column signal processing circuit 5 through a vertical signal line 9.

For example, the column signal processing circuit 5 is arranged for each column of the pixels 2, and performs signal processing such as noise reduction on a signal output from the pixels of one row for each pixel column. In other words, the column signal processing circuit 5 performs signal processing such as correlated double sampling (CDS) to remove fixed pattern noise specific to the pixel 2, signal amplification, and analog to digital (AD) conversion. A horizontal selecting switch (not shown) is connected between an output stage of the column signal processing circuit 5 and a horizontal signal line 10.

The output circuit 7 performs signal processing on signals sequentially supplied from the column signal processing circuits 5 through the horizontal signal line 10, and outputs the processing result. The input-output terminal 12 exchanges a signal with the outside.

Figure 2:
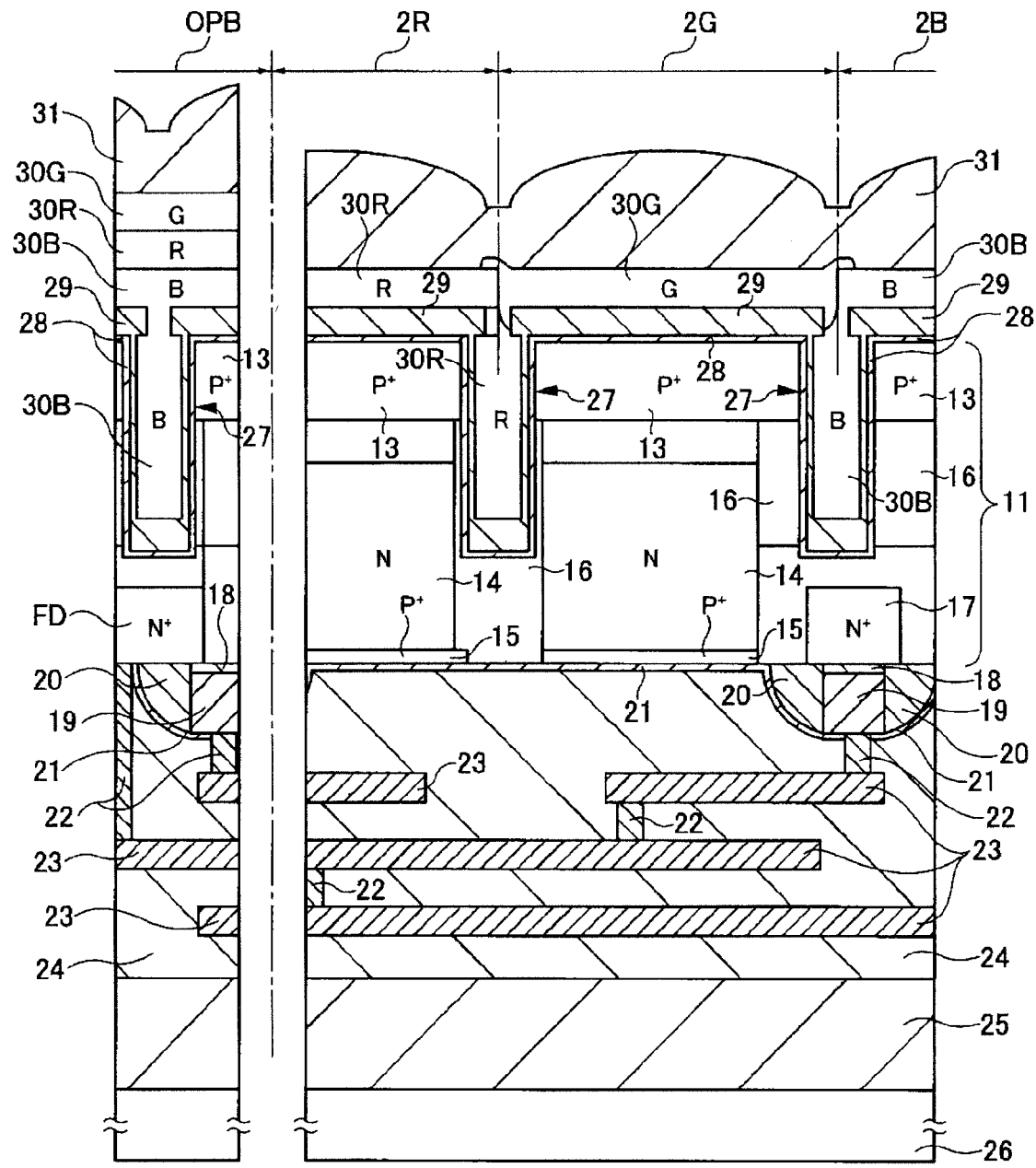
FIG. 2 is a cross-sectional view illustrating a main part of the solid-state imaging device according to the first embodiment.

Next, a cross-sectional view of a main part of the solid-state imaging device 1 according to the present embodiment is illustrated in FIG. 2. FIG. 2 illustrates a cross-sectional view of the pixel 2 of the pixel unit 3 of FIG. 1 and a cross-sectional view of a pixel of an optical black portion OPB formed outside the pixel unit 3 of FIG. 1.

As illustrated in FIG. 2, an N type photoelectric conversion unit 14 is formed on the semiconductor substrate 11, and a $P^+$ hole accumulation region 15 is formed below the photoelectric conversion unit 14. The hole accumulation region 15 is formed near a lower surface side interface of the semiconductor substrate 11. Above the photoelectric conversion unit 14, a P+ region 13 is formed from an upper surface side interface of the semiconductor substrate 11. A P type pixel separation region 16 is formed between the photoelectric conversion units 14 of the adjacent pixels. At the lower surface side of the semiconductor substrate 11, a floating diffusion FD and a source drain region 17 of a transistor are formed of an N+ semiconductor region.

A gate electrode 19 of a pixel transistor is formed below the semiconductor substrate 11 with a gate insulating film 18 interposed therebetween. For example, the pixel transistor is configured to include four transistors, that is, a transfer transistor, a reset transistor, an amplifying transistor, and a selecting transistor. The gate electrode 19 at the left of FIG. 2 serves to transfer charges from the photoelectric conversion unit 14 to the floating diffusion FD, and is a transfer gate electrode of the transfer transistor. The gate electrode 19 at the right of FIG. 2 serves as gate electrodes of the other pixel transistors (the reset transistor, the amplifying transistor, and the selecting transistor). Sidewall insulating layers 20 are formed at the left and right of the gate electrode 19. A salicide blocking film 21 is formed on the gate electrode 19, the side wall insulating layer 20, and a portion of the semiconductor substrate 11 on which the gate electrode 19 and the side wall insulating layer 20 are not formed to cover the lower surface side. The salicide blocking film 21 blocks the gate electrode 19 of the pixel unit and the surface of the semiconductor substrate 11 so that the gate electrode 19 of the pixel unit and the surface of the semiconductor substrate 11 are not salicidated when salicidation is performed in a transistor of a peripheral circuit unit or the like. A plug layer 22 made of a conductor is connected to the gate electrode 19 through a contact hole formed in the salicide blocking film 21. Another plug layer 22 is also connected to the floating diffusion FD. A multi-layer interconnection layer 23 is formed below the semiconductor substrate 11 and the gate electrode 19, the interconnection layers 23 of the respective layers are connected with each other by the plug layer 22, and the remaining portion is insulated by an interlayer insulating layer 24. An interconnection portion is configured with the plug layer 22, the multi-layer interconnection layer 23, and the interlayer insulating layer 24. An obtained signal of each pixel can be output by controlling the transfer gate, the floating diffusion FD, and the gate of the amplifying transistor using the plug layer 22 and the interconnection layer 23. An adhesive layer 25 is formed below the interconnection portion, and a support substrate 26 is formed below the adhesive layer 25.

Meanwhile, an insulating film 28 having a negative fixed charge, an insulating layer 29, and color filters 30R, 30G, and 30B of three colors of red (R), green (G), and blue (B), and an on-chip lens 31 are formed above the top surface of the semiconductor substrate 11 in the described order. The red color filter 30R is formed on a red pixel 2R, the green color filter 30G is formed on a green pixel 2G, and the blue color filter 30B is formed on a blue pixel 2B. A trench 27 is formed in a portion of the semiconductor substrate 11 between the pixels such that the semiconductor substrate 11 is caved inward. The insulating film 28 having the negative fixed charge and the insulating layer 29 are formed along the inner wall of the trench 27.

In the present embodiment, a color filter is buried, particularly, in the trench 27 between the pixels. Specifically, as illustrated in FIG. 2, the red color filter 30R is buried in the trench 27 between the green pixel 2G and the red pixel 2R, and the blue color filter 30B is buried in the trench 27 between the green pixel 2G and the blue pixel 2B.

In the pixel of the optical black portion OPB, the interconnection portion, the inside of the semiconductor substrate 11, and the inner wall of the trench 27 have the same configuration as in the pixel of the pixel unit. In the pixel of the optical black portion OPB, the blue color filter 30B is buried in the trench 27, the blue color filter 30B, the red color filter 30R, and the green color filter 30G are stacked, and the on-chip lens 31 is formed thereon.

Next, a color array of the pixels and an arrangement of the color filters of the solid-state imaging device according to the present embodiment will be described. FIG. 3A illustrates a color array pattern of the pixels of the solid-state imaging device according to the present embodiment. As illustrated in FIG. 3A, the green pixels 2G are obliquely arranged at intervals of pixels in each row and column, and the red pixel 2R and the blue pixel 2B are arranged in every other row and column. In other words, the pixels have the color array known as a Bayer array. In the solid-state imaging device according to the present embodiment, for the pixels 2 having the color array illustrated in FIG. 3A, the trenches 27 are formed between the pixels in a lattice form as illustrated in FIG. 3B.

FIG. 3C is a schematic plane view illustrating an arrangement of the color filters. As illustrated in FIG. 3C, the green color filter 30G is formed only on the portion of the green pixel 2G of FIG. 3A and is not formed in the trench 27 between the adjacent pixels. The blue color filter 30B is formed not only on the portion of the blue pixel 2B of FIG. 3A but also throughout the trench 27 between the adjacent pixels. The red color filter 30R is formed not only on the portion of the red pixel 2R of FIG. 3A but also over the trench 27 adjacent to the green pixel 2G In other words, not the green color filter 30G but the color filter 30R or 30B of the adjacent pixel is buried in the trench 27 around the green pixel 2G.

In the solid-state imaging device having the configuration in which the color filter is not buried between the pixels, when light enters from the green pixel with the highest sensitivity to the adjacent red pixel or blue pixel, the color mixture occurs in the red pixel or the blue pixel. At this time, in the red pixel or the blue pixel, hem floating of sensitivity spectrum (an increase in sensitivity near a center wavelength of green) occurs.

In the configuration of the present embodiment, since light incident on the green pixel 2G is green light, the green light is blocked by the red color filter 30R and the blue color filter 30B in the trench 27 and thus does not enter the adjacent red pixel 2R or the adjacent blue pixel 2B. Further, red light of the red pixel 2R or blue light of the blue pixel 2B passes through the color filters 30R and 30B in the trench 27 and enters the green pixel 2G, but this helps improve the sensitivity of the green pixel 2G and thus is not problematic. Since the light blocking material is not used in the trench 27, loss of sensitivity caused due to reflection or absorption can be suppressed.

Figure 4:
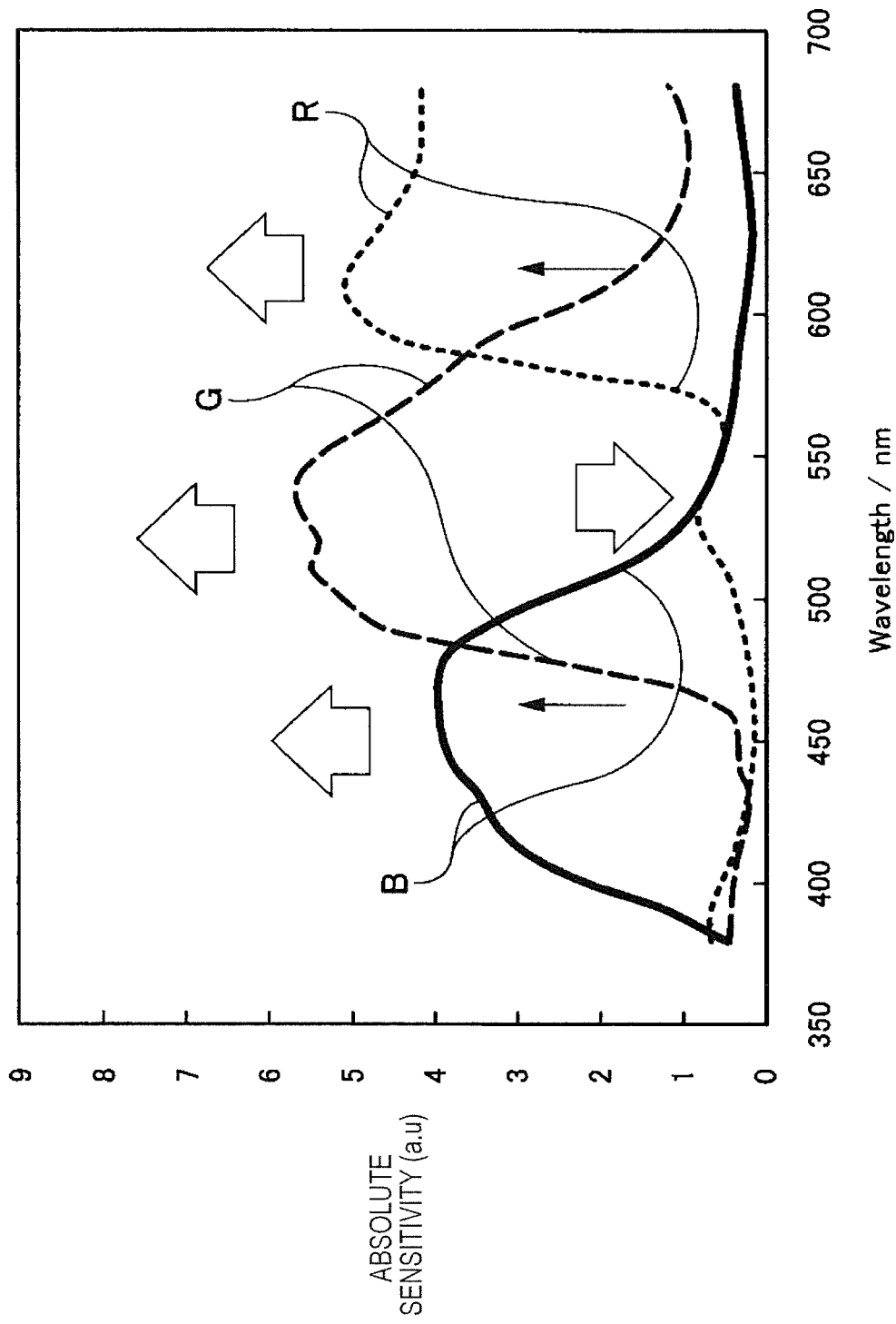
FIG. 4 is a diagram illustrating an image of an expected spectral result.

Here, an image of a spectral result expected by the configuration of the present embodiment is illustrated in FIG. 4. In FIG. 4, a horizontal axis represents a wavelength (nm), and a vertical axis represents absolute sensitivity (arbitrary unit). As indicated by arrows in FIG. 4, three colors of R, G, and B are expected to be improved in sensitivity near the center wavelength, and the hem floating of red (R) and blue (B) is expected to be suppressed.

Further, even when a void (hollow portion) occurs in the red color filter 30R or the blue color filter 30B buried in the trench 27, since a refractive index (about 2) of the color filter is larger than a refractive index (1) of the hollow portion, the color mixture can be suppressed. Further, even when the green color filter 30G slightly enters the inside of the trench 27, the hem floating caused by the color mixture can be suppressed when the red color filter 30R and the blue color filter 30B are formed in the trench 27.

The color filter layout rule according to the present embodiment is generalized as follows: when there is a significant difference in the color sensitivity between adjacent pixels, a color filter having the same color as a color of a pixel having low sensitivity is buried in a trench between pixels.

For example, the solid-state imaging device according to the present embodiment illustrated in FIG. 2 and FIG. 3 may be manufactured as follows.

Figure 5:
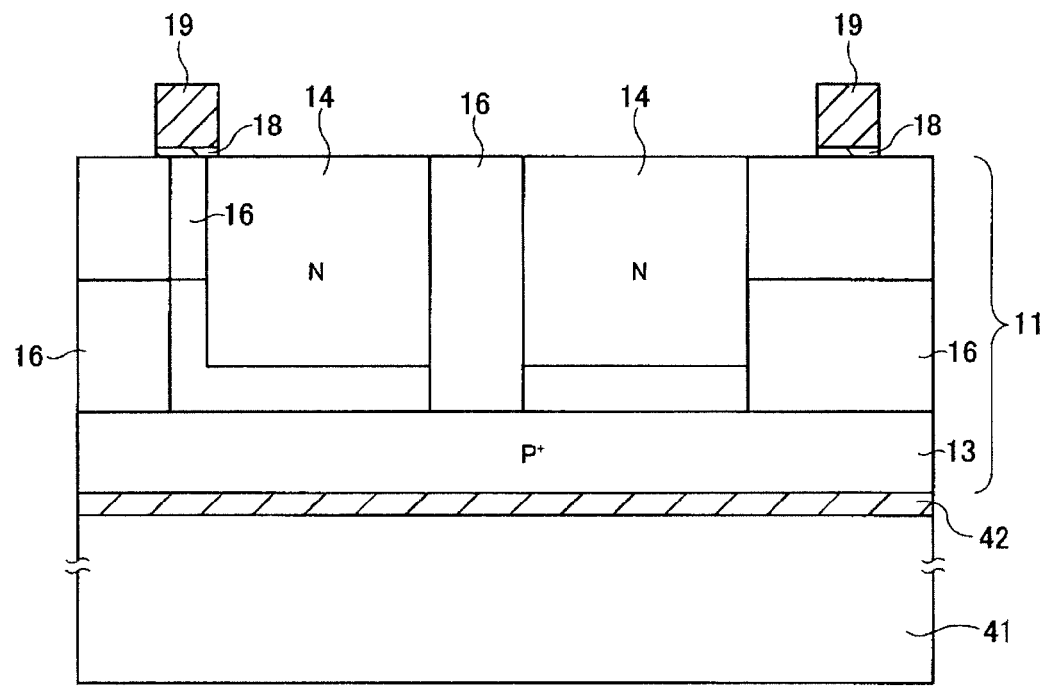
FIG. 5 is a process diagram illustrating a method of manufacturing the solid-state imaging device according to the first embodiment.

First of all, as illustrated in FIG. 5, a silicon layer of an SOI substrate including a silicon substrate 41, an oxide film 42, and a silicon layer is used as the semiconductor substrate 11. The silicon layer used as the semiconductor substrate 11 is assumed to have an N type. Then, in the semiconductor substrate 11, a $P^+$ region 13 is formed near an interface of the lower surface contacting the oxide film 42, and a P-well region is formed near an interface of the upper surface. For example, the regions are formed using ion implantation of boron and annealing at 1000° C. For example, the $P^+$ region 13 is formed such that boron is implanted by $5 \times 10^{12}/cm^2$ at 2.5 MeV, and the impurity concentration is $1 \times 10^{18}/cm^3$ or less. Then, in the semiconductor substrate 11, an N-type photoelectric conversion unit 14 is formed, for example, by ion implantation of phosphorus, and a P type pixel separation region 16 is formed, for example, using ion implantation of boron and annealing at 1000° C. Further, a thin insulating film is formed on the surface of the semiconductor substrate 11, and then a polycrystalline silicon layer is formed, for example, by a CVD technique. The thin insulating film and the polycrystalline silicon layer are patterned by a lithography technique to thereby form the gate insulating film 18 and the gate electrode 19 of the pixel transistor.

Figure 6:
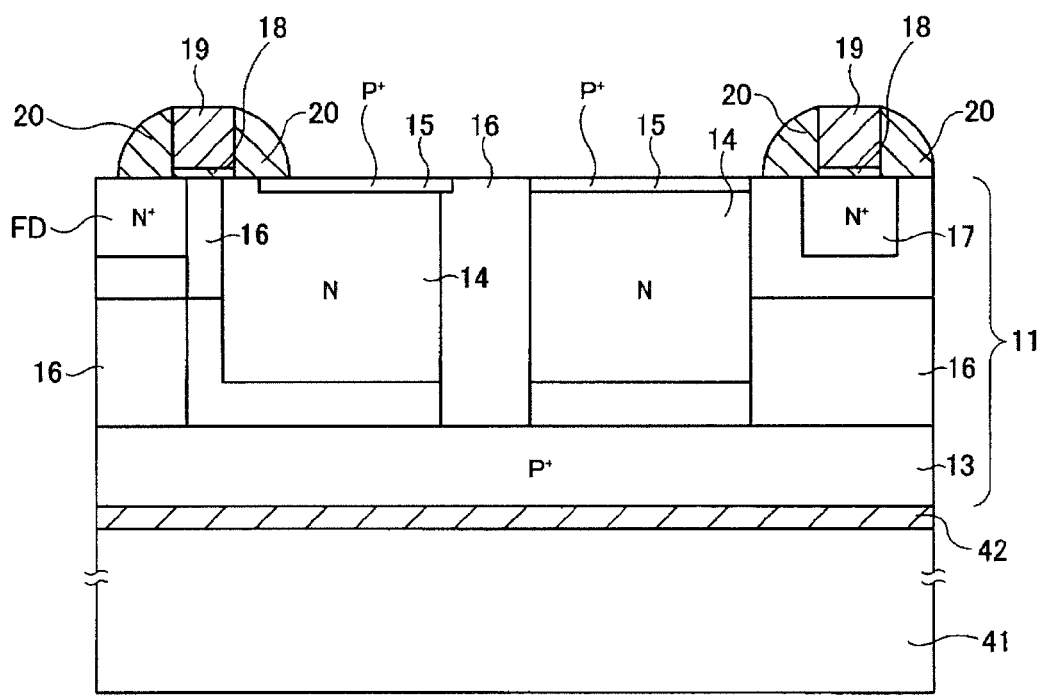
FIG. 6 is a process diagram illustrating a method of manufacturing the solid-state imaging device according to the first embodiment.

Next, as illustrated in FIG. 6, a side wall insulating layer 20 is formed on the side wall of the gate electrode 19. For example, the side wall insulating layer 20 is formed such that a TEOS film having a thickness of 20 nm is formed by decompression, a SiN film having a thickness of 100 nm is formed by decompression, and then dry etching is performed using $CF_4$-based gas. Thereafter, a $P^+$ hole accumulation region 15 is formed, for example, by ion implantation of boron. Further, an $N^+$ floating diffusion FD and a source drain region 17 is formed, for example, by ion implantation of arsenic and short-time annealing at 1100° C.

Figure 7:
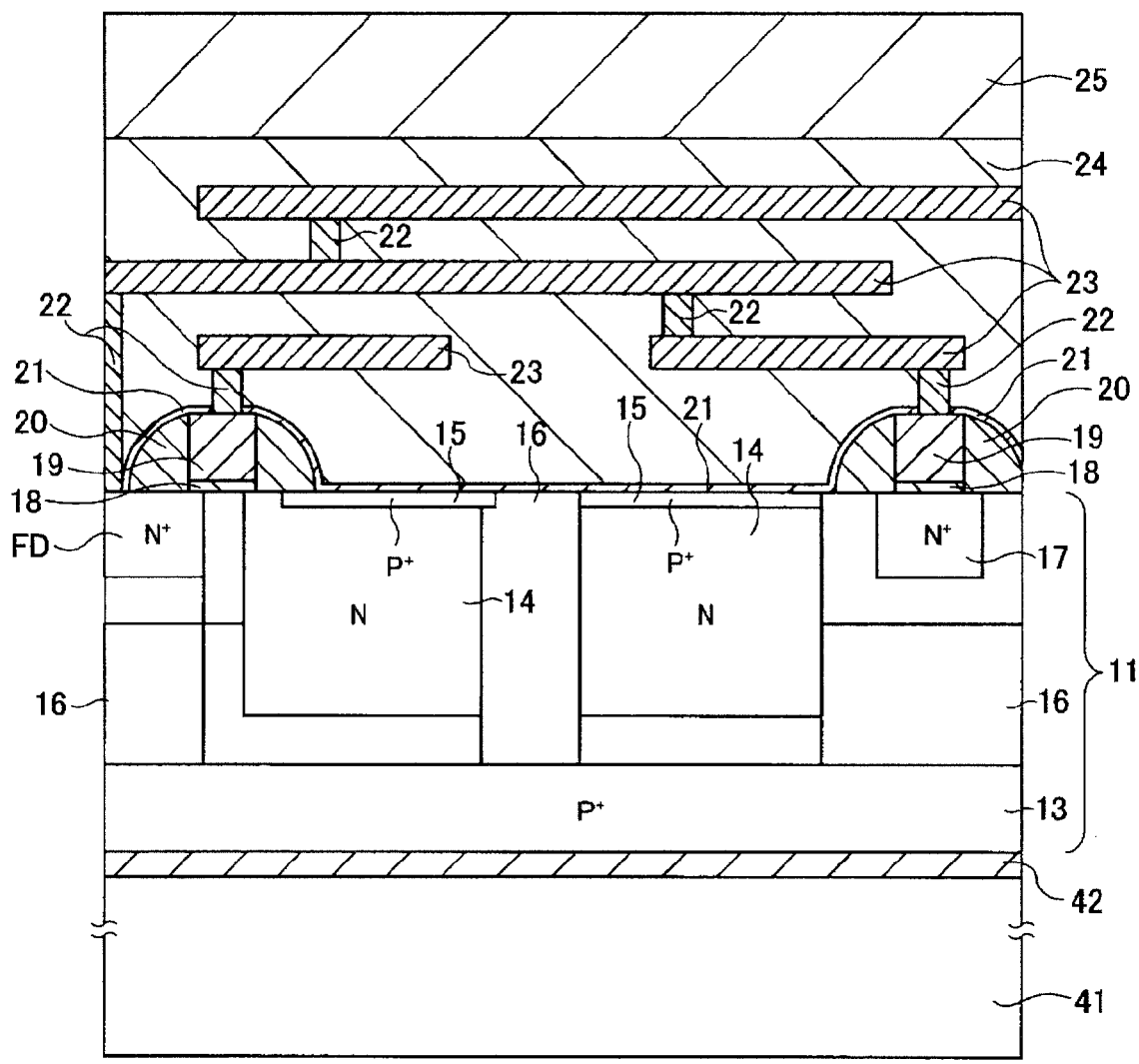
FIG. 7 is a process diagram illustrating a method of manufacturing the solid-state imaging device according to the first embodiment.

Next, as illustrated in FIG. 7, a salicide blocking film 21 is formed, an interlayer insulating layer 24 is formed, and a plug layer 22 and an interconnection layer 23 are formed. Thereafter, an adhesive layer 25 is deposited above the interconnection layer 23.

Figure 8:
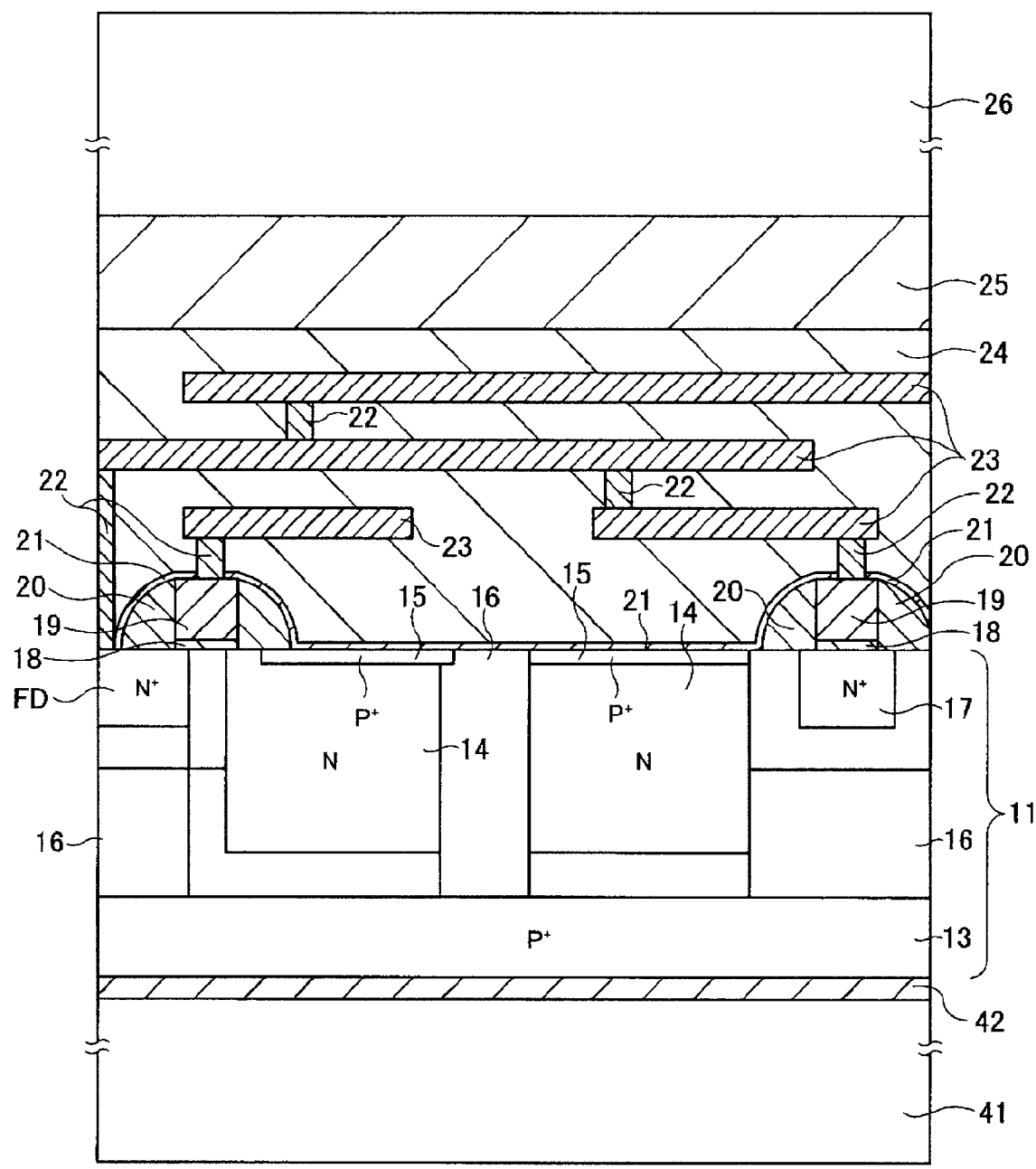
FIG. 8 is a process diagram illustrating a method of manufacturing the solid-state imaging device according to the first embodiment.

Next, as illustrated in FIG. 8, the adhesive layer 25 adheres to a support substrate 26, for example, using an organic adhesive. For example, a silicon substrate may be used as the support substrate 26.

Figure 9:
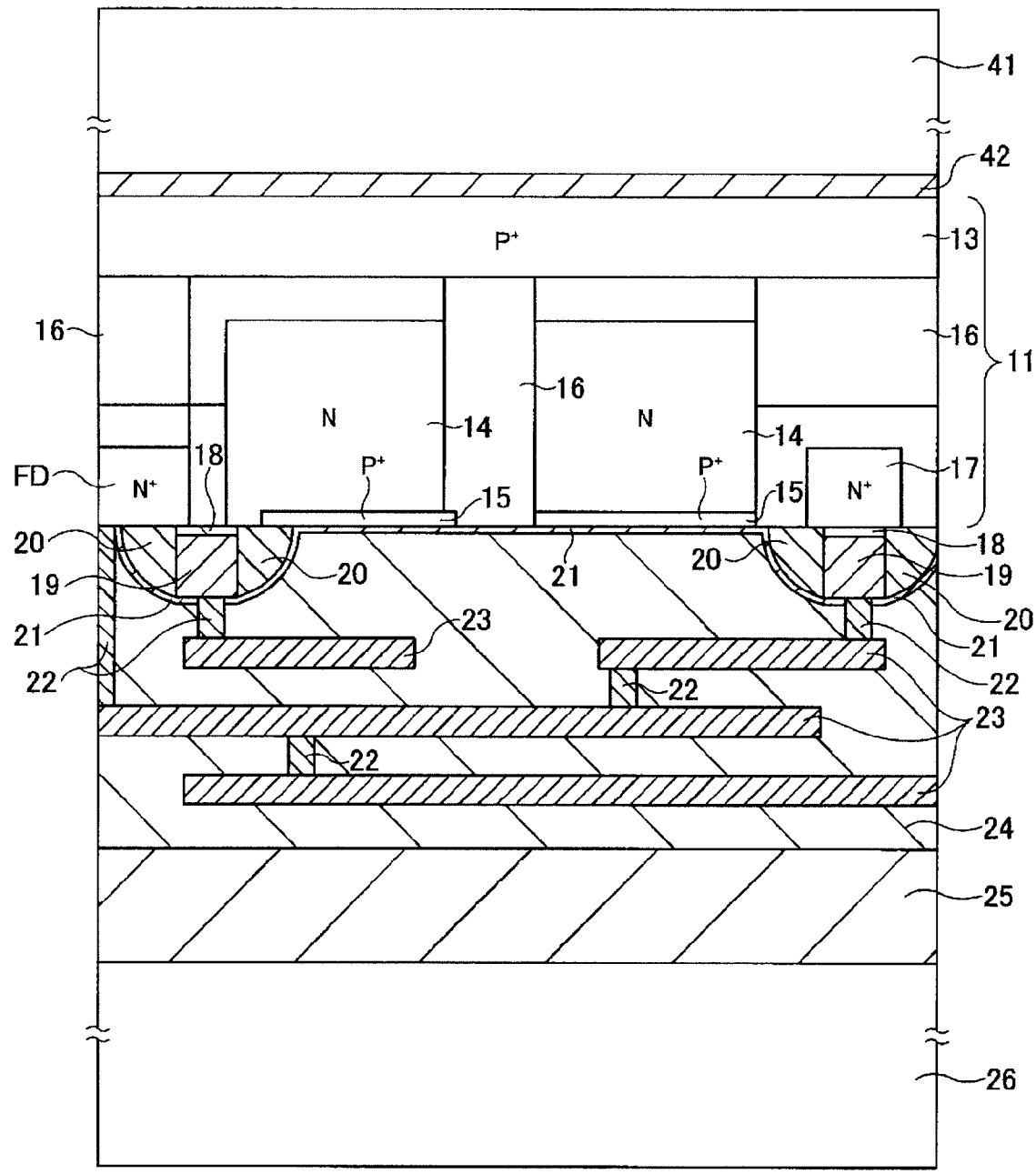
FIG. 9 is a process diagram illustrating a method of manufacturing the solid-state imaging device according to the first embodiment.
Figure 10:
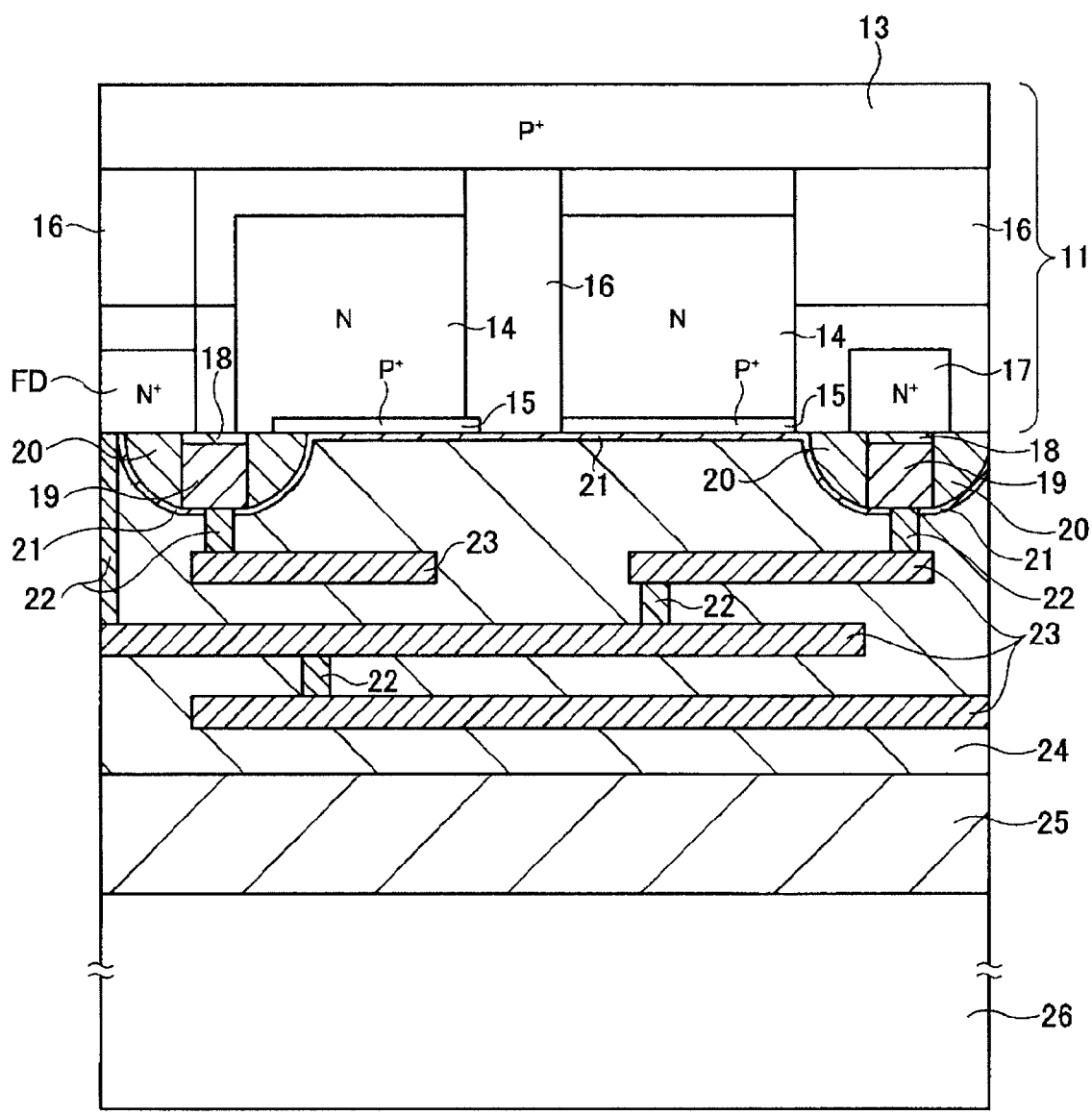
FIG. 10 is a process diagram illustrating a method of manufacturing the solid-state imaging device according to the first embodiment.

Next, as illustrated in FIG. 9, the whole substrate is inverted so that the support substrate 26 is arranged downward. Then, the silicon substrate 41 and the oxide film 42 of the SOI substrate are removed, and the $P^+$ region 13 is exposed as illustrated in FIG. 10.

Figure 11:
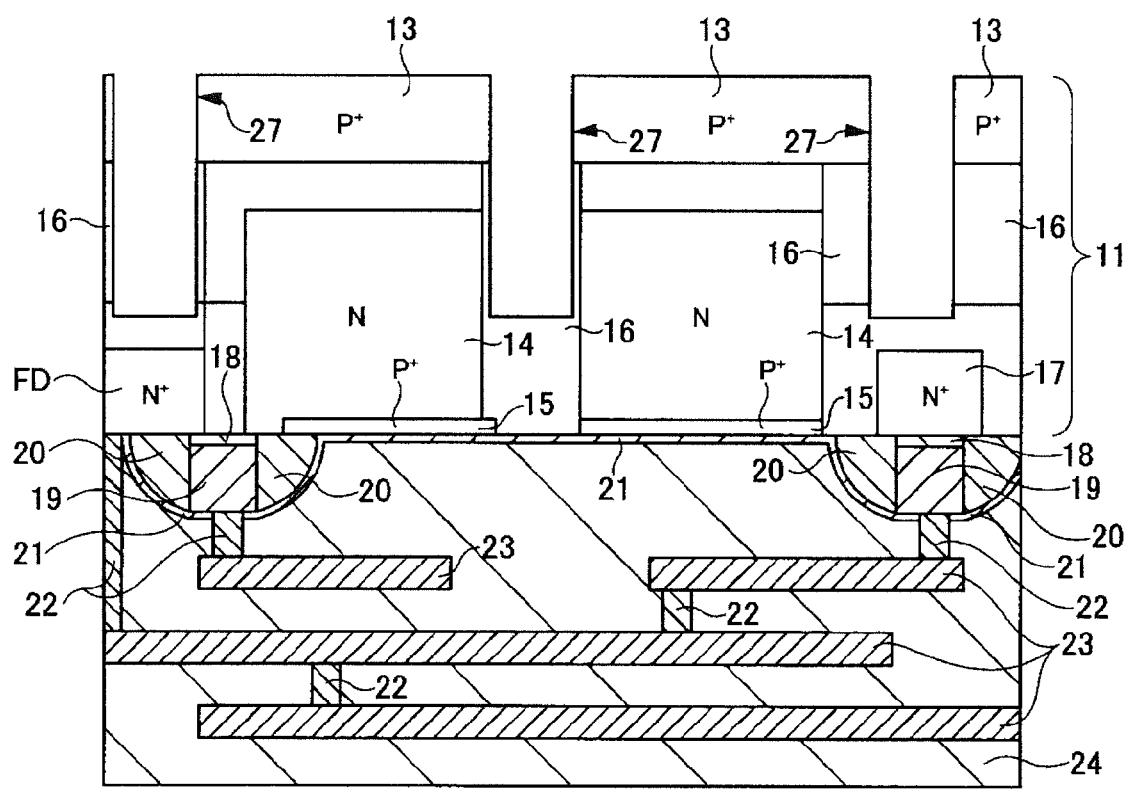
FIG. 11 is a process diagram illustrating a method of manufacturing the solid-state imaging device according to the first embodiment.

Next, as illustrated in FIG. 11, a trench 27 is formed in a portion of the semiconductor substrate 11 on which the pixel separation region 16 is formed using the lithography technique, and opened. For example, the trench 27 is formed such that the silicon substrate of the semiconductor substrate 11 is etched using $SF_6/C_4F_8$ as etching gas. The adhesive layer 25 and the support substrate 26 are not shown in FIG. 11.

Figure 12:
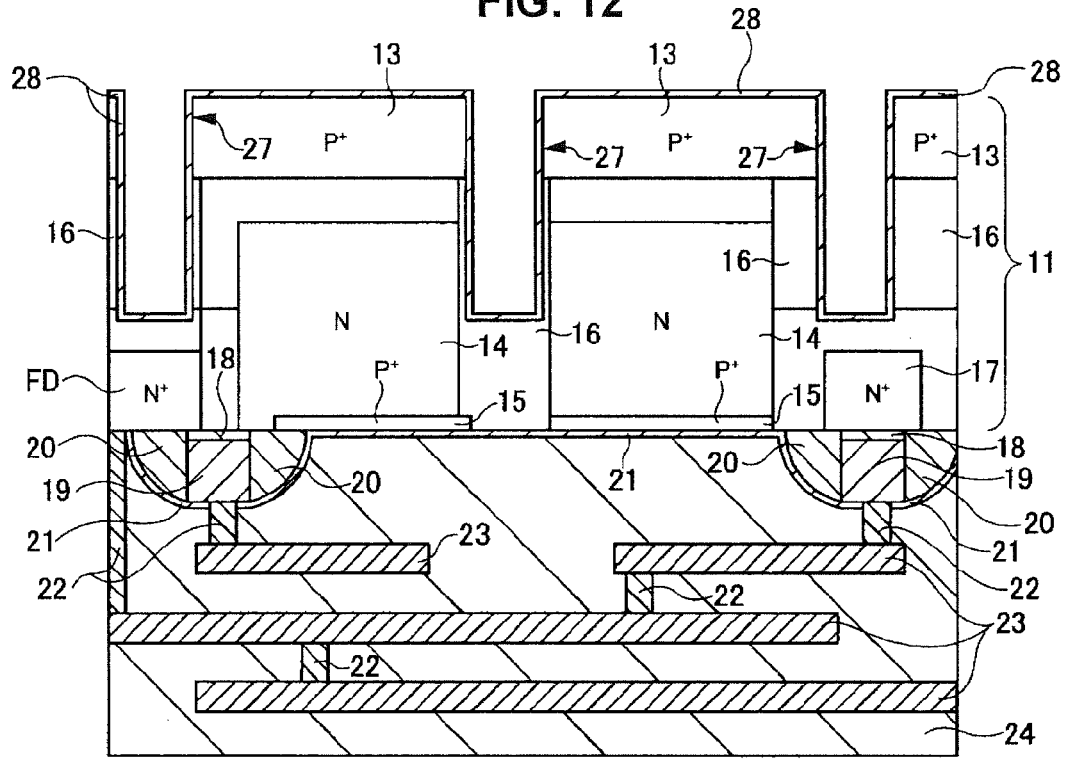
FIG. 12 is a process diagram illustrating a method of manufacturing the solid-state imaging device according to the first embodiment.

Thereafter, as illustrated in FIG. 12, an insulating film 28 having the negative fixed charge is formed. Accordingly, the insulating film 28 having the negative fixed charge is formed on the inner wall of the trench 27 and the top surface of the semiconductor substrate 11.

Figure 13:
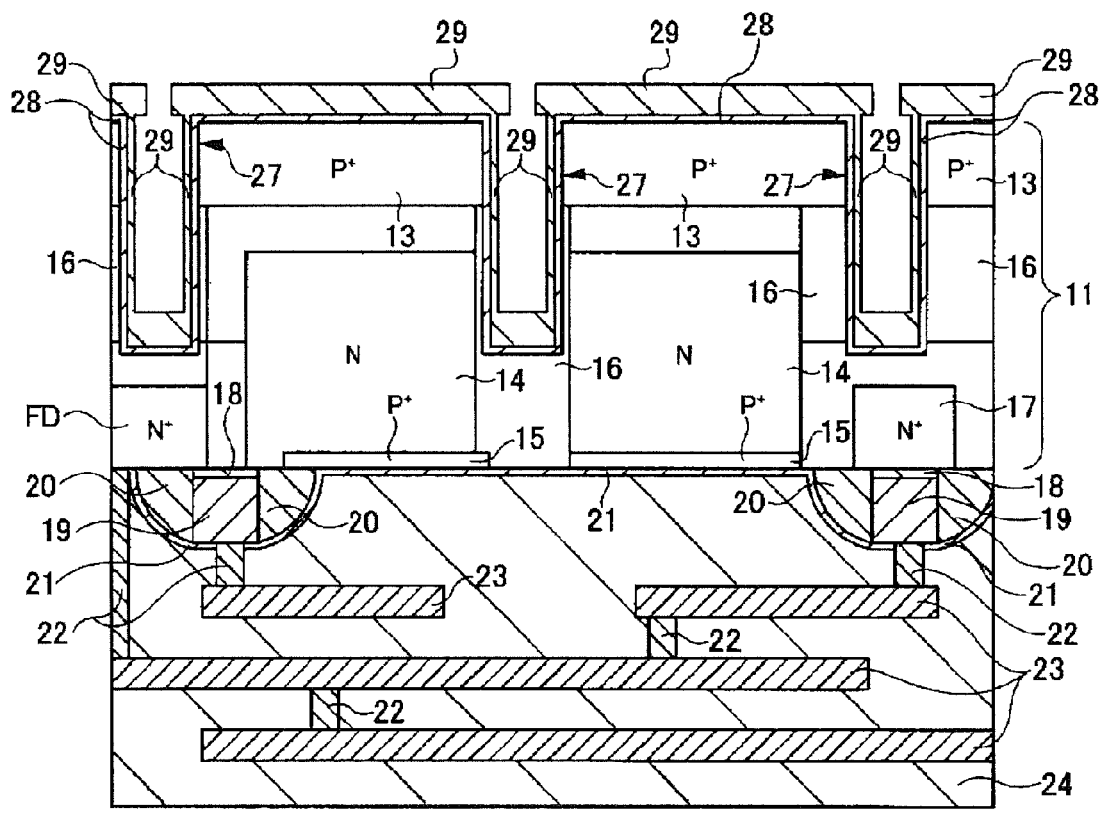
FIG. 13 is a process diagram illustrating a method of manufacturing the solid-state imaging device according to the first embodiment.

Next, as illustrated in FIG. 13, an insulating layer 29 is formed over the whole surface from the surface to the inside of the trench 27. For example, a silicon oxide layer is formed at the thickness of 50 nm using a plasma CVD apparatus. Here, as the insulating layer 29, the silicon oxide layer is formed, but a nitride film or an organic film that transmits light may be formed as necessary. Further, the insulating layer 29 may not be formed.

Figure 14:
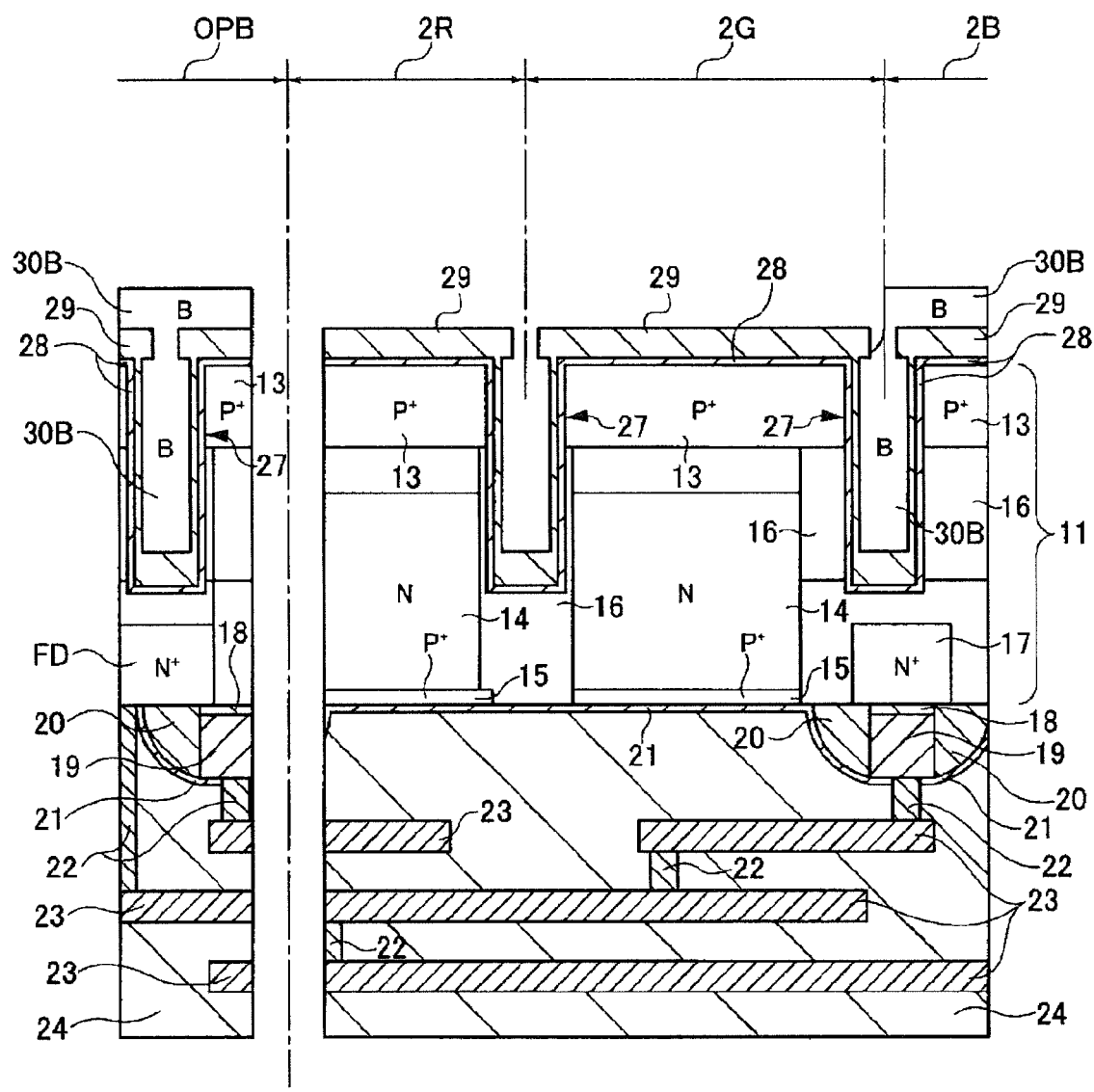
FIG. 14 is a process diagram illustrating a method of manufacturing the solid-state imaging device according to the first embodiment.

Next, as illustrated in FIG. 14, a blue color filter 30B is formed, for example, using a coating apparatus and an exposure apparatus. Starting from the process illustrated in FIG. 14, similarly to FIG. 2, a cross-sectional view that is divided into the pixel of the optical black portion OPB and the pixels 2R, 2G, and 2B of three colors of the pixel unit is illustrated. At this time, the blue color filter 30B remains in the optical black portion OPB. In other words the blue color filters 30B are formed on the pixel of the optical black portion OPB and the trench 27, on the blue pixel 2B, in the trench 27 between the blue pixel 2B and the green pixel 2G, and in the trench 27 between the blue pixel 2B and the red pixel 2R (see FIG. 3C). Even when the color filter is insufficiently buried in the trench 27 due to misalignment of the pattern of the color filter and thus a void (a hollow portion) or an opening occurs thereinside, it is not problematic.

Figure 15:
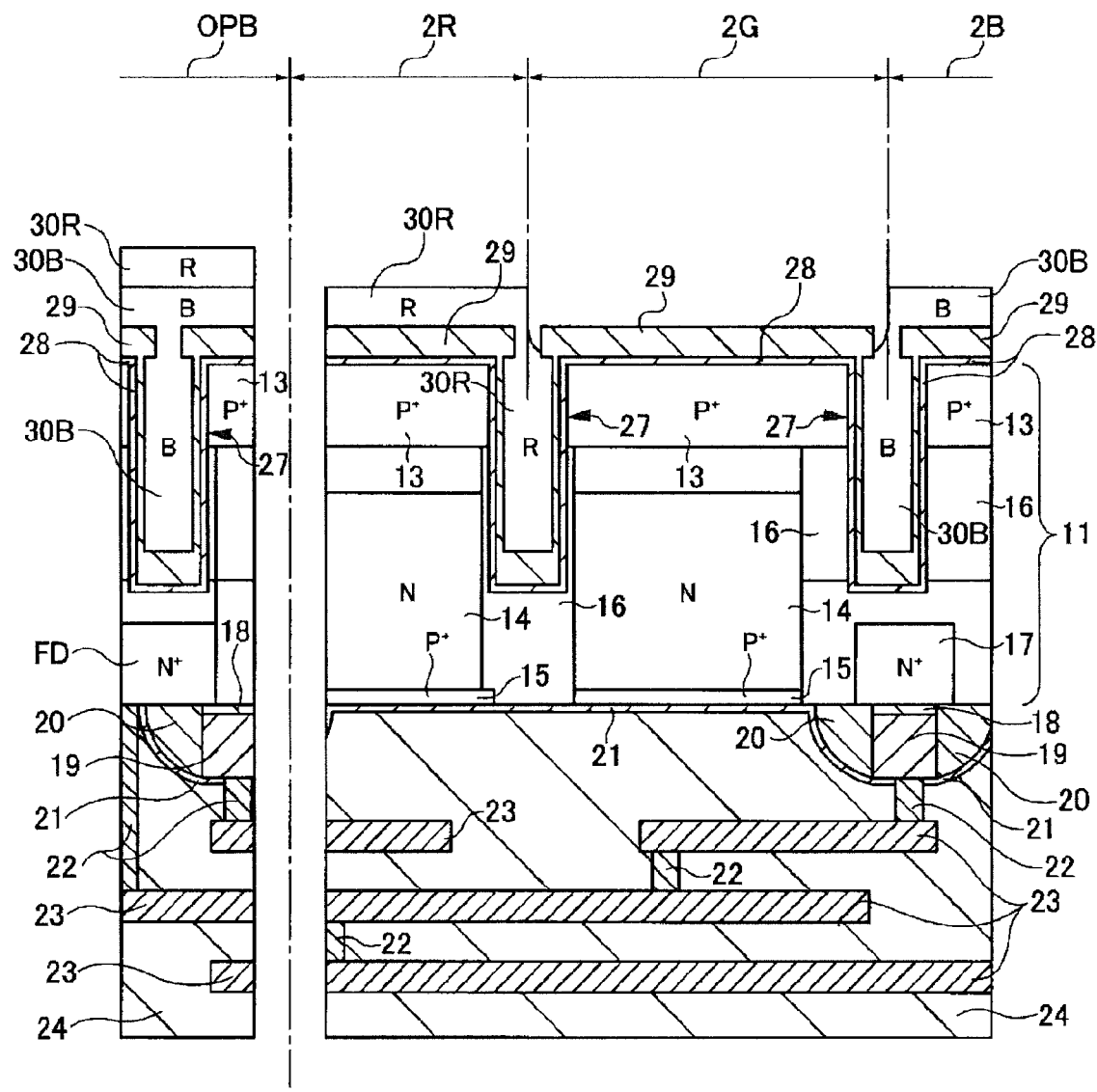
FIG. 15 is a process diagram illustrating a method of manufacturing the solid-state imaging device according to the first embodiment.

Next, as illustrated in FIG. 15, a red color filter 30R is formed, for example, using a coating apparatus and an exposure apparatus. At this time, the red color filter 30R remains in the optical black portion OPB. In other words, the red color filters 30R are formed on the pixel of the optical black portion OPB, the red pixel 2R, and in the trench 27 between the red pixel 2R and the green pixel 2G. Even when the color filter is insufficiently buried in the trench 27 due to misalignment of the pattern of the color filter and thus a void (a hollow portion) or an opening occurs thereinside, it is not problematic.

Figure 16:
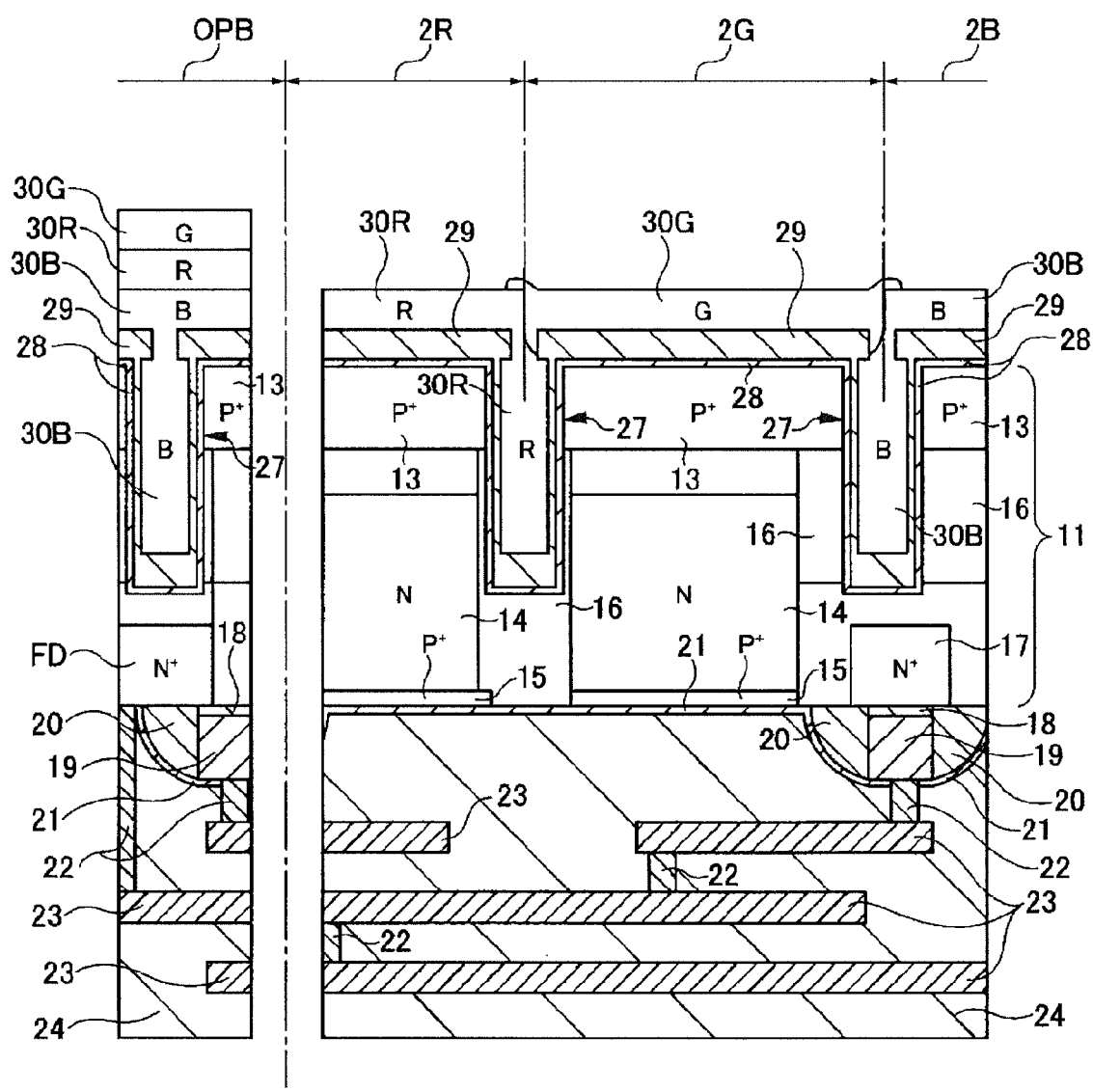
FIG. 16 is a process diagram illustrating a method of manufacturing the solid-state imaging device according to the first embodiment.

Next, as illustrated in FIG. 16, a green color filter 30G is formed, for example, using a coating apparatus and an exposure apparatus. At this time, the red color filter 30R remains in the optical black portion OPB. In other words, the green color filters 30G are formed on the pixel of the optical black portion OPB and the green pixel 2G Even when the green color filter 30G extends into the void (hollow portion) or the opening occurring in the process illustrated in FIG. 14 or 15, it is not problematic.

Figure 17:
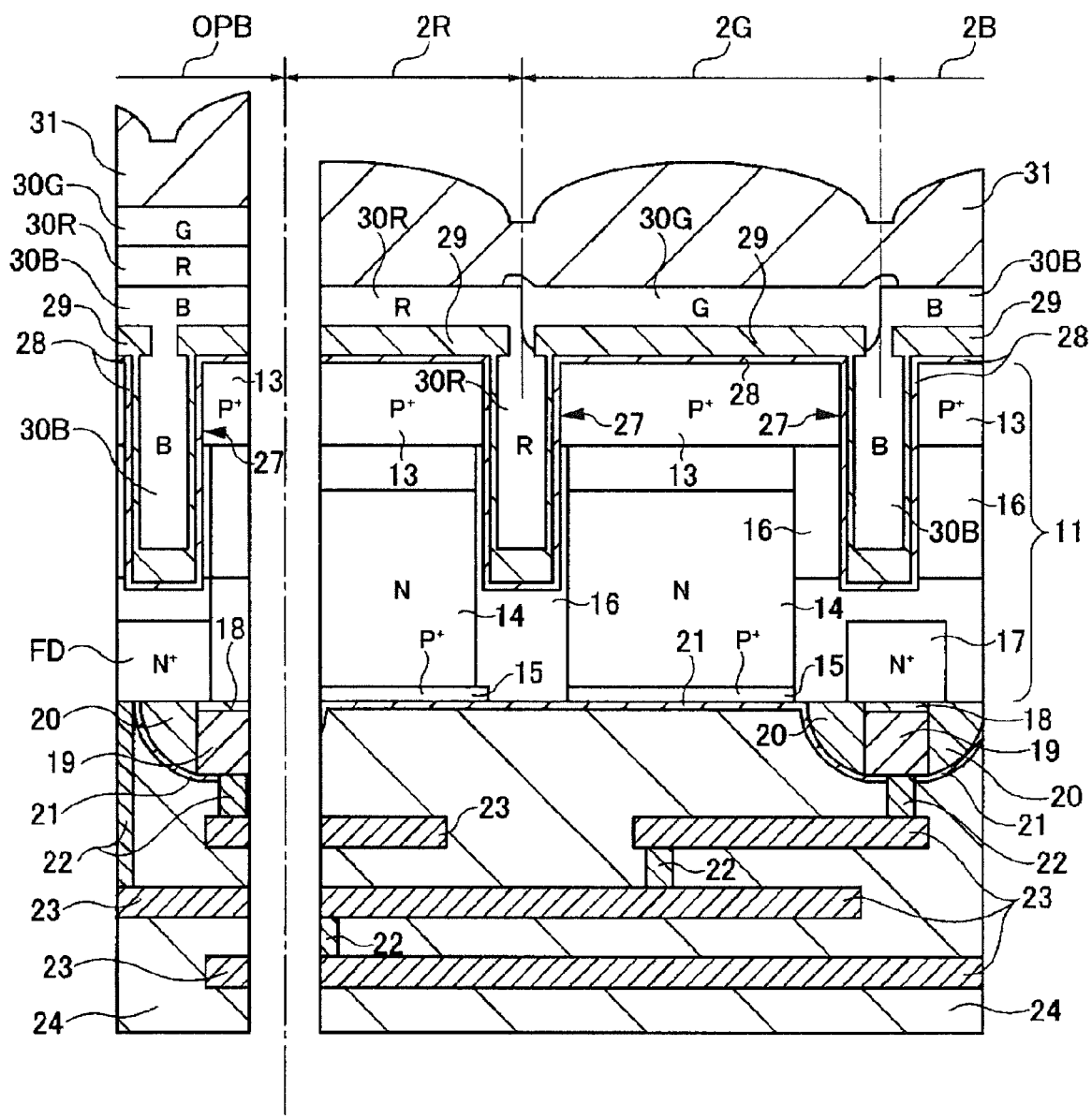
FIG. 17 is a process diagram illustrating a method of manufacturing the solid-state imaging device according to the first embodiment.

Next, as illustrated in FIG. 17, an on-chip lens 31 is formed on the color filters 30B, 30R, and 30G.

Figure 3:
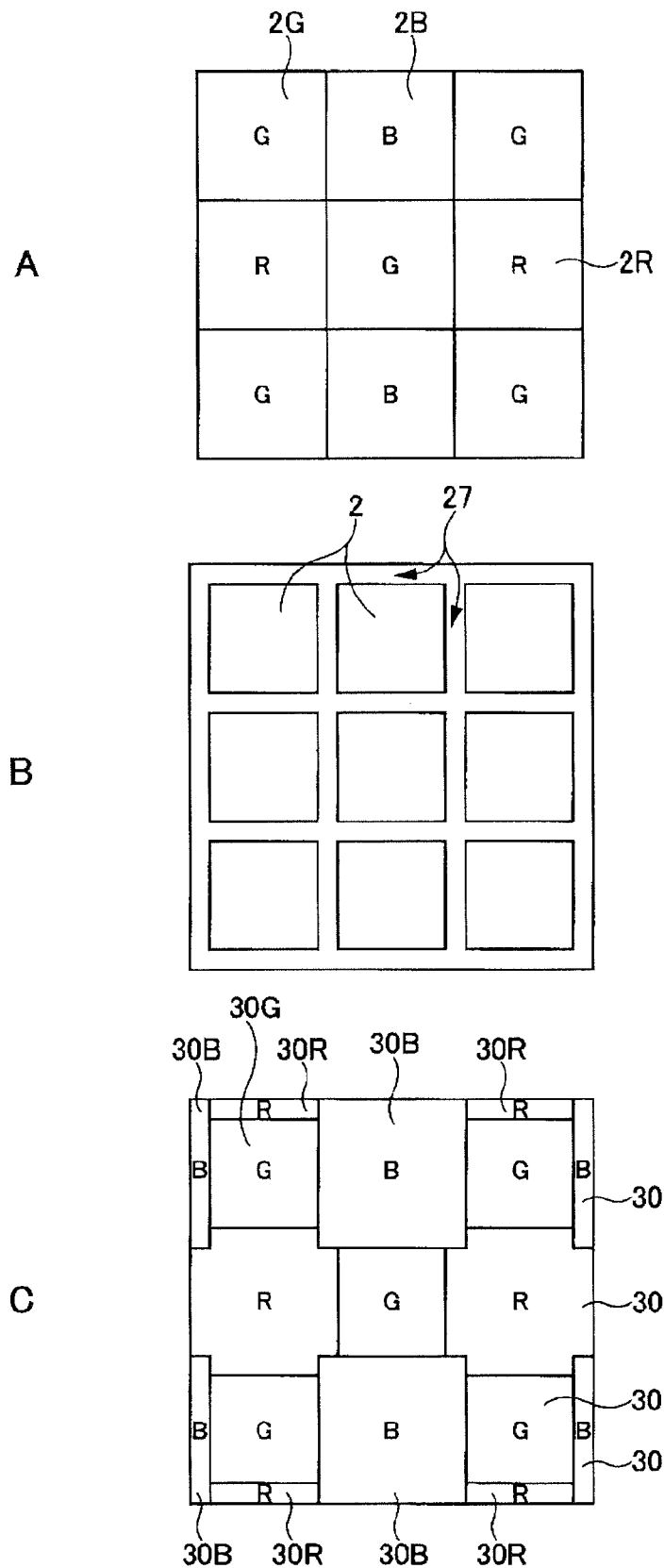
FIGS. 3A to 3C are diagrams for describing a color array of pixels and a color filter array in the solid-state imaging device according to the first embodiment.

The solid-state imaging device according to the present embodiment illustrated in FIGS. 2 and 3 may be manufactured as described above.

In the present embodiment, in the optical black portion OPB requesting light shielding, instead of arranging a light blocking film (metallic film), the color filters 30B, 30R, and 30G of three colors are arranged to overlap one another. Thus, it is unnecessary to perform the process of forming a light blocking film (metallic film) in the optical black portion OPB.

Further, in the coating or exposure process of the color filter, a pattern error may occur, but the solid-state imaging device according to the present embodiment has the structure in which the color filters 30B and 30R are formed in the trench 27, and thus the color filter is unlikely to peel.

According to the configuration of the solid-state imaging device according to the present embodiment, the color filters 30R and 30B are buried in the trench 27 between the pixels. Thus, through the color filters 30R and 30B in the trench 27, light can be prevented from filtering into an adjacent pixel, and the occurrence of the color mixture can be suppressed. Further, since a light blocking material such as a metal is not used in the trench 27, loss of sensitivity caused by reflection or absorption can be also suppressed. Accordingly, the sensitivity can be improved while suppressing the color mixture.

Further, the red color filter 30R is buried in the trench 27 between the pixels in which the green pixel 2G is adjacent to the red pixel 2R, and the blue color filter 30B is buried in the trench 27 between the pixels in which the green pixel 2G is adjacent to the blue pixel 2B. As a result, green light can be prevented from filtering from the green pixel 2G having the highest sensitivity to the red pixel 2R or the blue pixel 2B adjacent thereto, and the occurrence of the hem floating caused by the color mixture can be suppressed.

According to the method of manufacturing the solid-state imaging device of the present embodiment, since the trench 27 is formed between the adjacent pixels, and the color filters 30B and 30R are formed to be buried in the trench 27, light can be prevented from filtering into the adjacent pixel, and the occurrence of the color mixture can be suppressed. Further, since the color filters 30B and 30R are formed over the photoelectric conversion unit 14 of the pixel and the color filters 30B and 30R are formed to be buried in the trench 27, the color filters 30B and 30R can be simultaneously formed at the positions. As a result, the number of processes can be reduced compared to the case in which the light blocking material or the like is formed in the trench separately from the color filter.

In addition, according to the configuration and the method of manufacturing the solid-state imaging device according to the present embodiment, in the pixel of the optical black portion OPB, the color filters 30B, 30R, and 30G of the three layers are accumulated to form the light blocking film. Thus, the color filter of the photoelectric conversion unit 14 of the pixel unit and the light blocking film of the optical black portion OPB can be simultaneously formed, and thus the number of processes can be reduced.

<2. Second Embodiment (Solid-state Imaging Device)>

Figure 18:
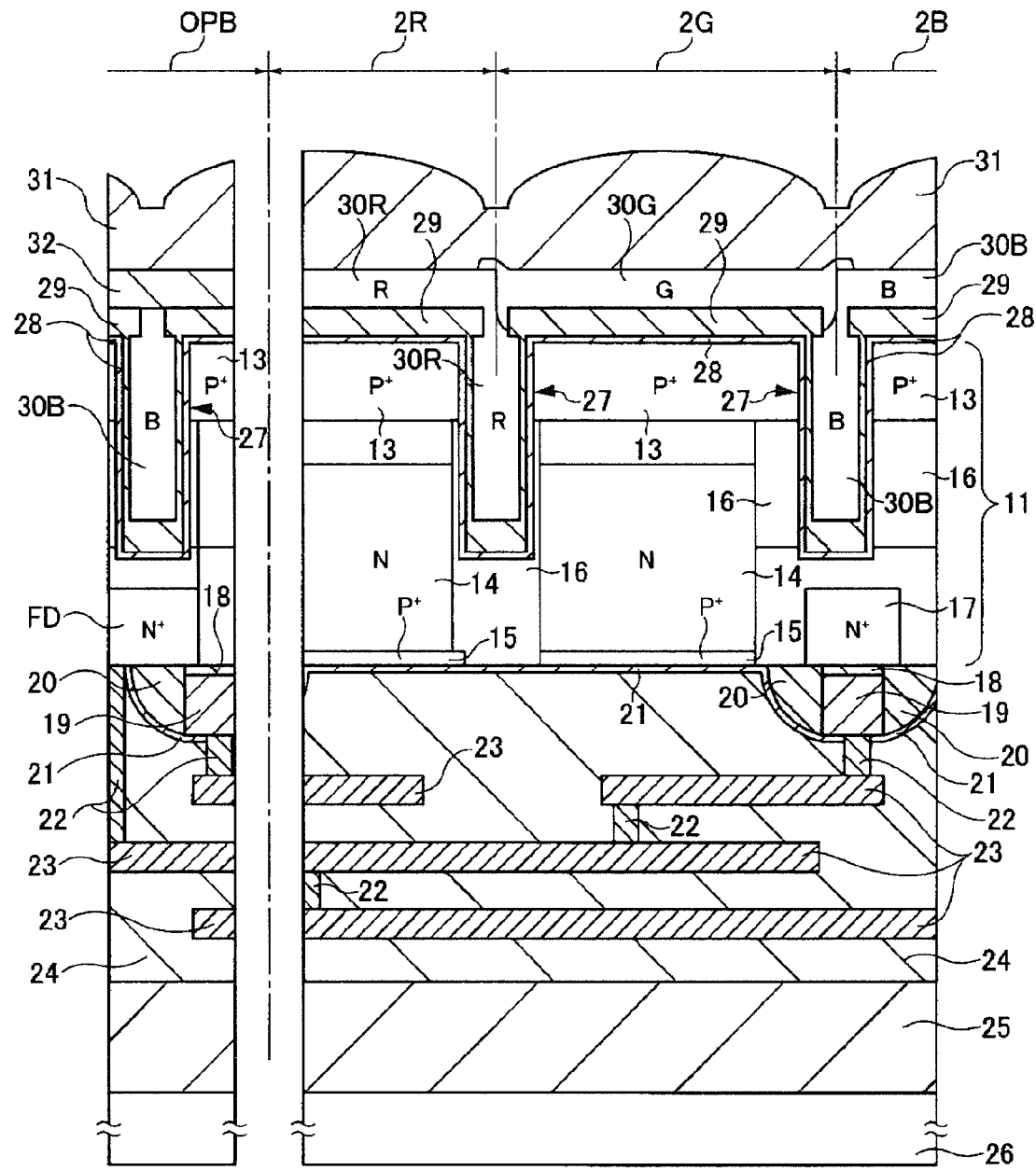
FIG. 18 is a cross-sectional view illustrating a main part of a solid-state imaging device according to a second embodiment.

FIG. 18 is a schematic configuration diagram (cross-sectional view) of a solid-state imaging device according to a second embodiment. The present embodiment relates to an example in which the present technology is applied to a CMOS image sensor having a backside illumination type structure.

In the solid-state imaging device according to the present embodiment, particularly, as illustrated in FIG. 18, in the pixel of the optical black portion OPB, the color filter is formed only in the trench 27, and the pixel is covered with a light blocking film 32. The pixels 2R, 2G, and 2B of the three colors of the pixel unit have the same structure as in the first embodiment illustrated in FIG. 2. Thus, the configuration according to the present embodiment also satisfies the above-mentioned layout rule "when there is a significant difference in the color sensitivity between adjacent pixels, a color filter having the same color as a color of a pixel having low sensitivity is buried in a trench between pixels."

The remaining configuration is the same as in the first embodiment, and the configuration illustrated in the plane view of FIG. 1 may be employed.

In the solid-state imaging device according to the present embodiment, since the pixel of the pixel unit has the same structure as in the first embodiment, similarly to the first embodiment, green light incident on the green pixel 2G does not enter the red pixel 2R or the blue pixel 2B adjacent thereto, and thus the occurrence of the hem floating can be suppressed. Further, since the light blocking material is not used in the trench 27, loss of sensitivity caused by reflection or absorption can be suppressed.

For example, the solid-state imaging device according to the present embodiment may be manufactured as will be described below.

Figure 19:
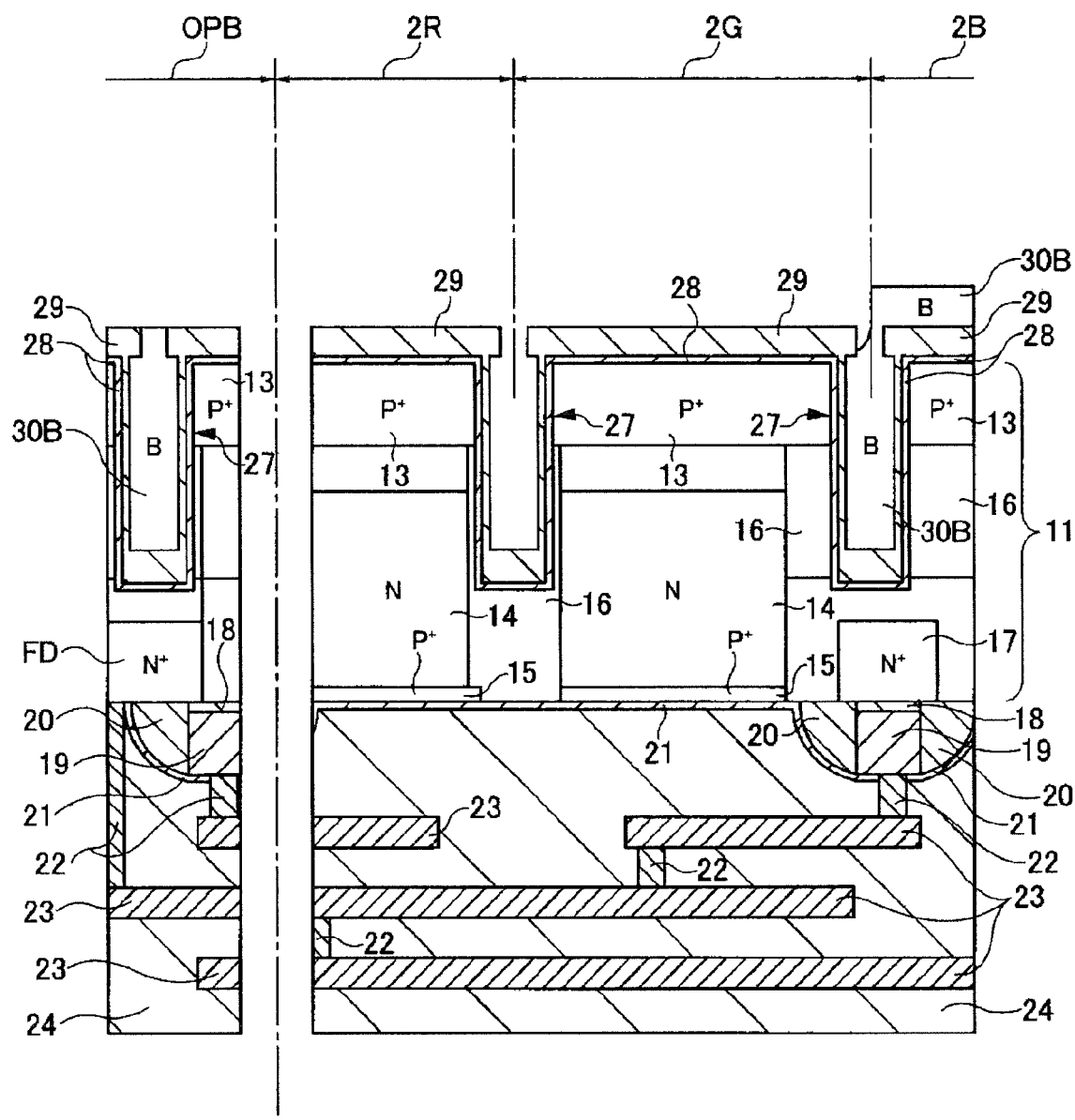
FIG. 19 is a process diagram illustrating a method of manufacturing the solid-state imaging device according to the second embodiment.

First of all, the same processes as the processes illustrated in FIGS. 5 to 13 in the method of manufacturing the solid-state imaging device according to the first embodiment are performed. Then, as illustrated in FIG. 19, a blue color filter 30B is formed, for example, using a coating apparatus and an exposure apparatus. In the pixels 2R, 2G, and 2B of the pixel unit, similarly to the process illustrated in FIG. 14 in the first embodiment, the blue color filters 30B are formed on the blue pixel 2B, in the trench 27 between the blue pixel 2B and the green pixel 2G, and in the trench 27 between the blue pixel 2B and the red pixel 2R. In the optical black portion OPB, the blue color filter 30B is buried in the trench 27, and the blue color filter 30B on the surface is removed.

Figure 20:
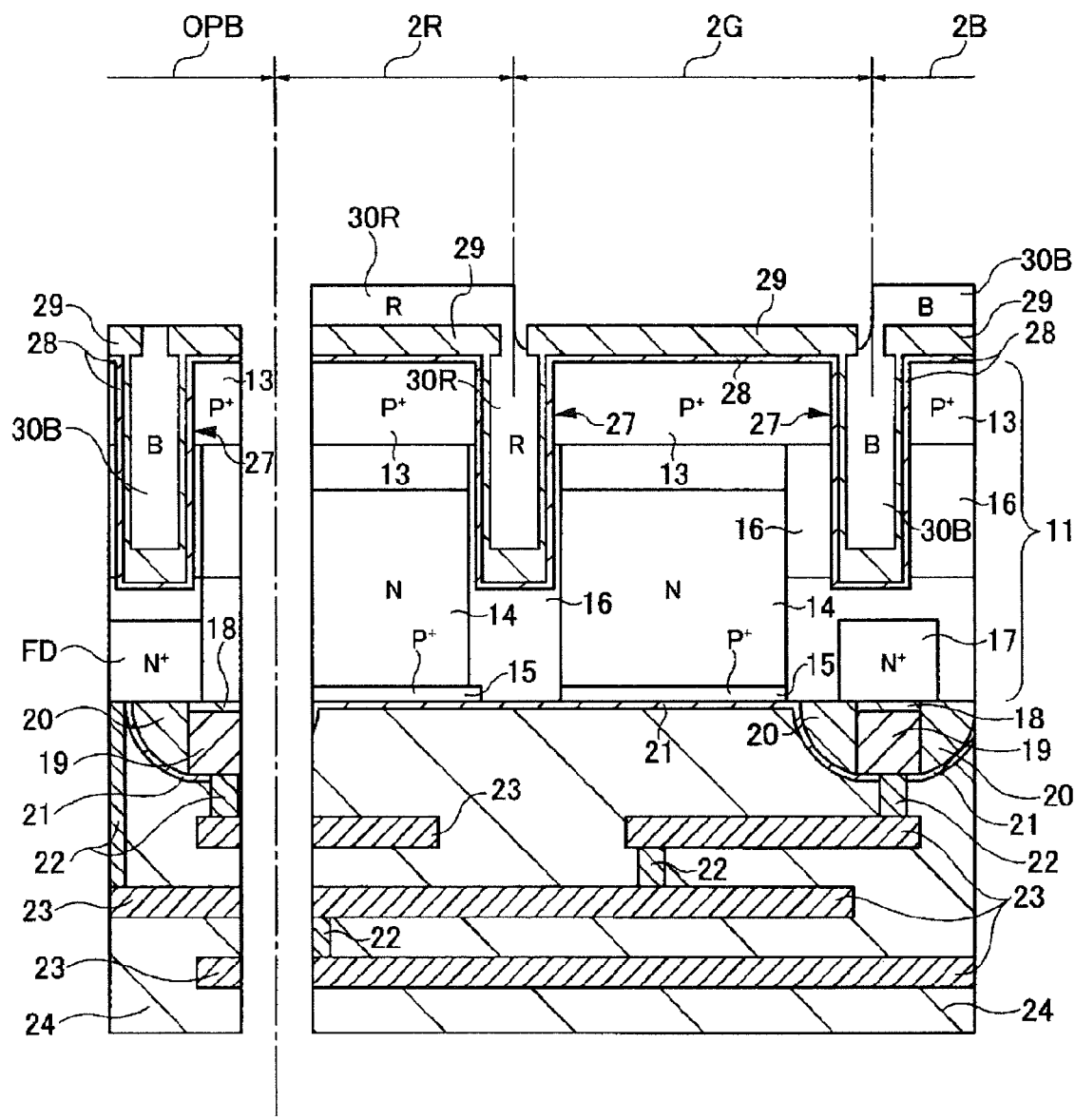
FIG. 20 is a process diagram illustrating a method of manufacturing the solid-state imaging device according to the second embodiment.

Next, as illustrated in FIG. 20, a red color filter 30R is formed, for example, using a coating apparatus and an exposure apparatus. In the pixels 2R, 2G, and 2B of the pixel unit, similarly to the process illustrated in FIG. 15 in the first embodiment, the red color filters 30R are formed on the red pixel 2R and in the trench 27 between the red pixel 2R and the green pixel 2G In the optical black portion OPB, the red color filter 30R on the surface is removed.

Figure 21:
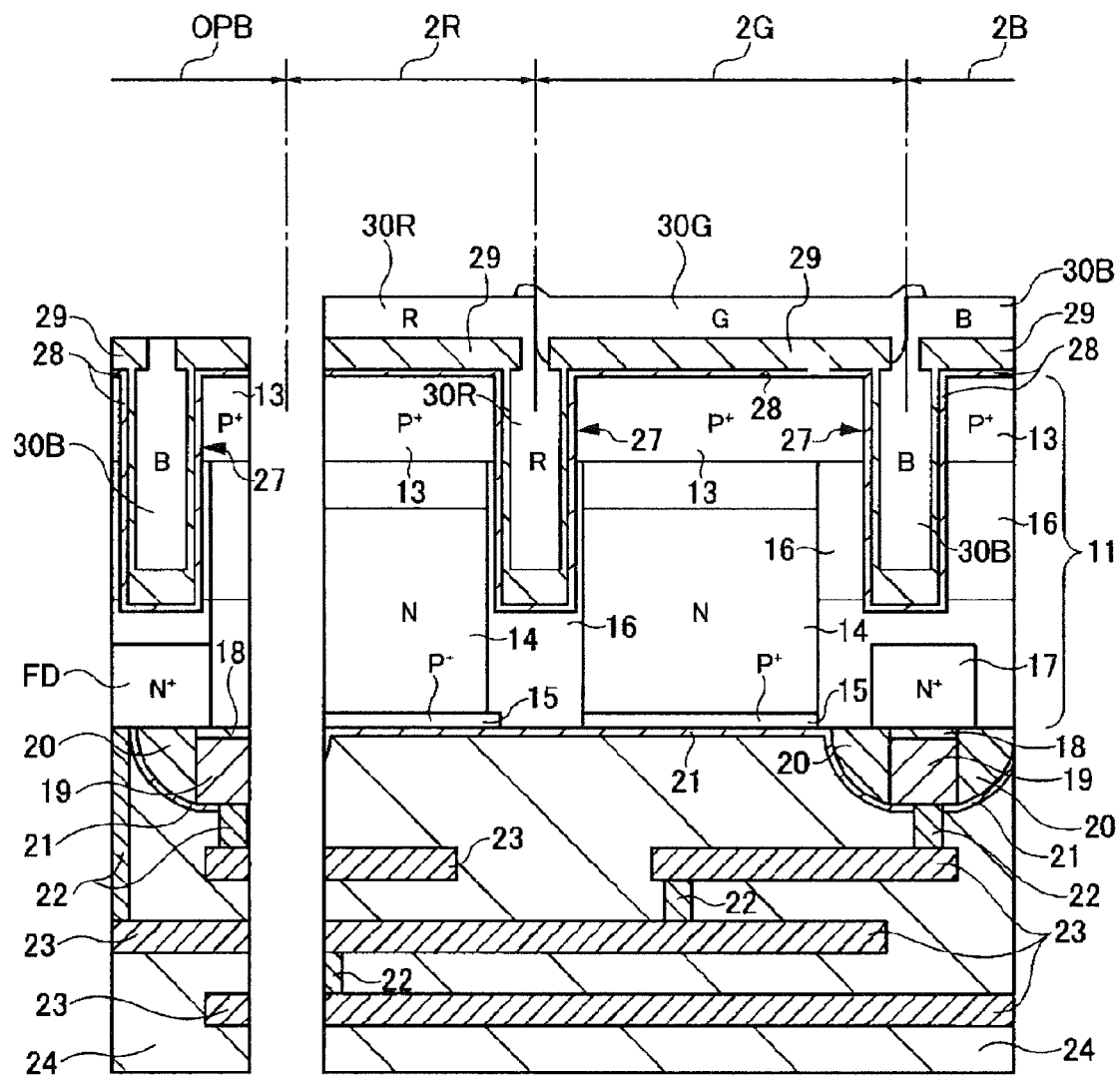
FIG. 21 is a process diagram illustrating a method of manufacturing the solid-state imaging device according to the second embodiment.

Next, as illustrated in FIG. 21, the green color filter 30G is formed, for example, using a coating apparatus and an exposure apparatus. In the pixels 2R, 2G, and 2B of the pixel unit, similarly to the process illustrated in FIG. 16 in the first embodiment, the green color filter 30G is formed on the green pixel 2G In the optical black portion OPB, the green color filter 30G on the surface is removed.

Figure 22:
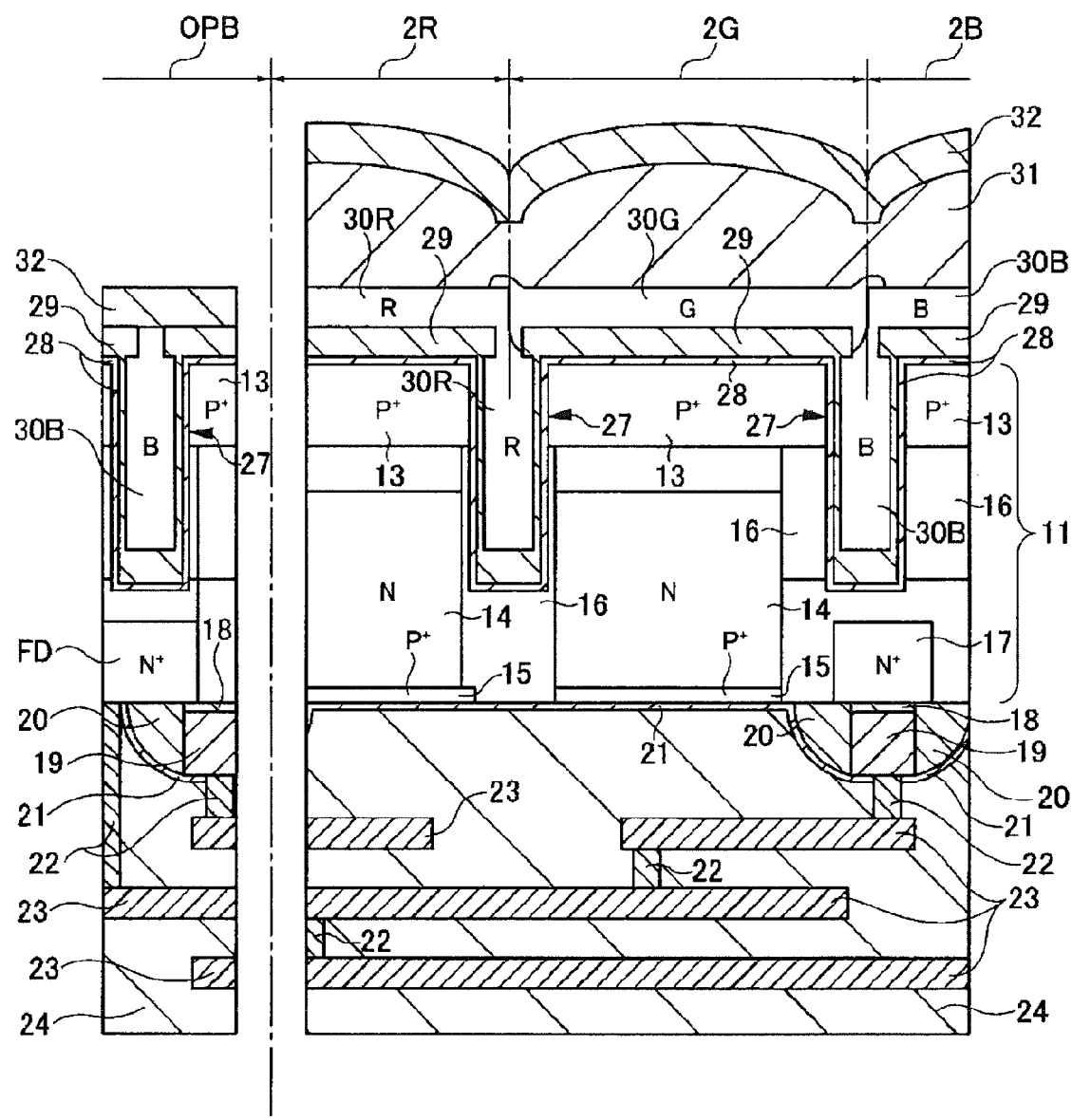
FIG. 22 is a process diagram illustrating a method of manufacturing the solid-state imaging device according to the second embodiment.

Next, after the on-chip lens 31 is formed on the surface, the on-chip lens 31 in the optical black portion OPB is removed. Further, as illustrated in FIG. 22, a light blocking film 32 is formed on the surface using a metallic film or the like at a temperature at which the on-chip lens 31 and the like are not damaged. In the optical black portion OPB, the color filter and the on-chip lens are not formed, and thus the light blocking film 32 is formed on the insulating layer 29.

Figure 23:
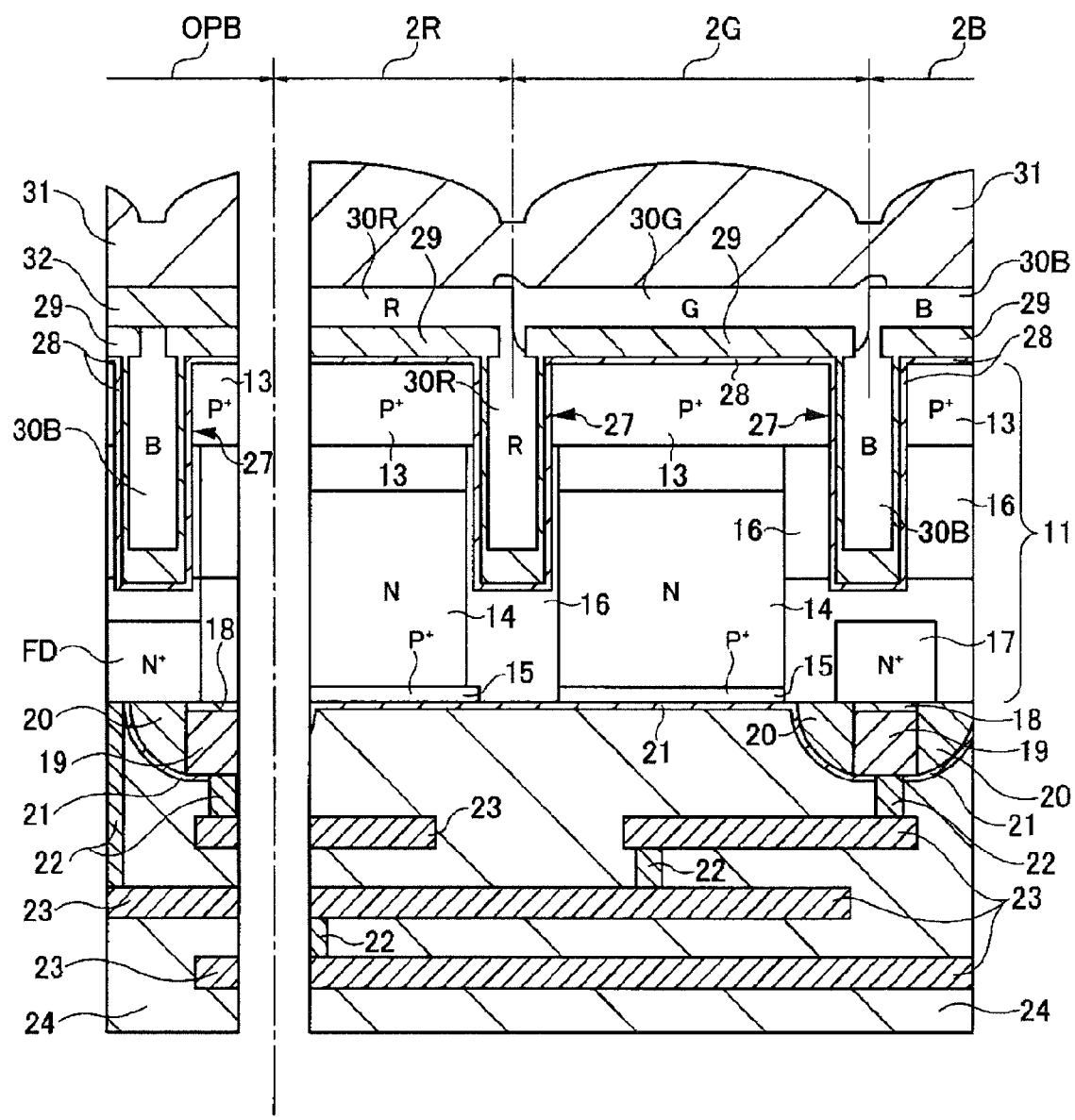
FIG. 23 is a process diagram illustrating a method of manufacturing the solid-state imaging device according to the second embodiment.

Then, when the on-chip lens 31 is peeled off, the light blocking film 32 on the on-chip lens 31 of the pixel unit is peeled off together with the on-chip lens 31. At this time, the light blocking film 32 in the optical black portion OPB remains as is. Thereafter, as illustrated in FIG. 23, the on-chip lens 31 is formed again. In the pixel unit, the on-chip lens 31 is formed on the color filters 30R, 30G, and 30B, and in the optical black portion OPB, the on-chip lens 31 is formed on the light blocking film 32.

The solid-state imaging device according to the present embodiment illustrated in FIG. 18 can be manufactured as described above.

In FIGS. 18 to 23, the blue color filter 30B is buried in the trench 27 in the optical black portion OPB, but the red color filter 30R or the green color filter 30G may be buried in the trench 27 in the optical black portion OPB.

Further, the first to third layers of the color filters 30B, 30R, and 30G may remain on the surface of the optical black portion OPB. Further, it is preferable that the color filter not remain on the surface in the optical black portion OPB since the distance between the semiconductor substrate 11 and the light blocking film 32 is reduced and thus a light blocking effect can be improved.

According to the configuration of the solid-state imaging device according to the present embodiment, the color filters 30R and 30B are buried in the trench 27 between the pixels. Thus, through the color filters 30R and 30B in the trench 27, light can be prevented from filtering into the adjacent pixel, and the occurrence of the color mixture can be suppressed. Further, since a light blocking material such as a metal is not used in the trench 27, loss of sensitivity caused by reflection or absorption can be suppressed. Accordingly, the sensitivity can be improved while suppressing the color mixture.

Further, the red color filter 30R is buried in the trench 27 between the pixels in which the green pixel 2G is adjacent to the red pixel 2R, and the blue color filter 30B is buried in the trench 27 between the pixels in which the green pixel 2G is adjacent to the blue pixel 2B. As a result, green light can be prevented from filtering from the green pixel 2G having the highest sensitivity to the red pixel 2R or the blue pixel 2B adjacent thereto, and the occurrence of the hem floating caused by the color mixture can be suppressed.

According to the method of manufacturing the solid-state imaging device of the present embodiment, since the trench 27 is formed between the adjacent pixels, and the color filters 30B and 30R are formed to be buried in the trench 27, light can be prevented from filtering into the adjacent pixel, and the occurrence of the color mixture can be suppressed. Further, since the color filters 30B and 30R are formed over the photoelectric conversion unit 14 of the pixel and the color filters 30B and 30R are formed to be buried in the trench 27, the color filters 30B and 30R can be simultaneously formed at the positions. As a result, the number of processes can be reduced compared to the case in which the light blocking material or the like is formed in the trench separately from the color filter.

<3. Third Embodiment (Solid-state Imaging Device)>

Next, a configuration of a solid-state imaging device according to a third embodiment will be described. FIG. 24A is a plane view illustrating a color array of pixels in the solid-state imaging device according to the third embodiment, and FIG. 24B is a plan view illustrating a color filter array.

In the present embodiment, a so-called honeycomb array is used as the color array of the pixels. As illustrated in FIG. 24A, the green pixel 2G is arranged at intervals of pixels, similarly to the Bayer array illustrated in FIG. 3A. However, the red pixel 2R and the blue pixel 2B are arranged such that the pixels having the same color are consecutive to each other at the corners of the pixels, unlike the Bayer array illustrated in FIG. 3A. When the color filters 30R, 30G, and 30B of the three colors are arranged in the pixels and the trench between the pixels according to the same rule as in FIGS. 3A to 3C, the blue color filter 30B and the red color filter 30R are formed to be consecutive to each other at the corners of the pixels, as illustrated in FIG. 24B. The configuration according to the present embodiment also satisfies the above-mentioned layout rule "when there is a significant difference in the color sensitivity between adjacent pixels, a color filter having the same color as a color of a pixel having low sensitivity is buried in a trench between pixels."

The remaining configuration is the same as in the first embodiment, and the configuration illustrated in the plane view of FIG. 1 or the configuration illustrated in the cross-sectional view of FIG. 2 may be employed.

According to the configuration of the solid-state imaging device according to the present embodiment, the color filters 30R and 30B are buried in the trench between the pixels. Thus, through the color filters 30R and 30B in the trench, light can be prevented from filtering into the adjacent pixel, and the occurrence of the color mixture can be suppressed. Further, since a light blocking material such as a metal is not used in the trench, loss of sensitivity caused by reflection or absorption can be suppressed. Accordingly, the sensitivity can be improved while suppressing the color mixture.

Further, the red color filter 30R is buried in the trench between the pixels in which the green pixel 2G is adjacent to the red pixel 2R, and the blue color filter 30B is buried in the trench between the pixels in which the green pixel 2G is adjacent to the blue pixel 2B. As a result, green light can be prevented from filtering from the green pixel 2G having the highest sensitivity to the red pixel 2R or the blue pixel 2B adjacent thereto, and the occurrence of the hem floating caused by the color mixture can be suppressed.

<4. Fourth Embodiment (Solid-state Imaging Device)>

Next, a configuration of a solid-state imaging device according to a fourth embodiment will be described. FIG. 25A is a plane view illustrating a color array of pixels in the solid-state imaging device according to the fourth embodiment, and FIG. 25B is a plan view illustrating a color filter array.

In the present embodiment, a so-called clear bit array is used as the color array of the pixels. As illustrated in FIG. 25A, the red pixel 2R and the blue pixel 2B are arranged in every other row and column. In the corresponding row and the corresponding column, red-green-blue-green-red is repeatedly arranged. In the other rows and columns, the green pixels 2G are consecutively arranged. In the case of this array, since there are positions in which the green pixels 2G are consecutive vertically or horizontally, the green color filter 30G is buried in a trench between pixels at the corresponding position. Thus, the color filter array has a configuration in which the green color filters 30G are consecutively formed, and the red color filter 30R and the blue color filter 30B are discretely formed in the form of an island as illustrated in FIG. 25B. The red color filter 30R or the blue color filter 30B is buried in each trench around the red pixel 2R and the blue pixel 2B. The configuration according to the present embodiment also satisfies the above-mentioned layout rule "when there is a significant difference in the color sensitivity between adjacent pixels, a color filter having the same color as a color of a pixel having low sensitivity is buried in a trench between pixels."

The remaining configuration is the same as in the first embodiment, and the configuration illustrated in the plane view of FIG. 1 or the configuration illustrated in the cross-sectional view of FIG. 2 may be employed.

According to the configuration of the solid-state imaging device according to the present embodiment, the color filters 30R, 30G, and 30B are buried in the trench between the pixels. Thus, through the color filters 30R, 30G, and 30B in the trench, light can be prevented from filtering into the adjacent pixel, and the occurrence of the color mixture can be suppressed. Further, since a light blocking material such as a metal is not used in the trench, loss of sensitivity caused by reflection or absorption can be suppressed. Accordingly, the sensitivity can be improved while suppressing the color mixture.

Further, the red color filter 30R is buried in the trench between the pixels in which the green pixel 2G is adjacent to the red pixel 2R, and the blue color filter 30B is buried in the trench between the pixels in which the green pixel 2G is adjacent to the blue pixel 2B. As a result, green light can be prevented from filtering from the green pixel 2G having the highest sensitivity to the red pixel 2R or the blue pixel 2B adjacent thereto, and the occurrence of the hem floating caused by the color mixture can be suppressed.

<5. Fifth Embodiment (Solid-state Imaging Device)>

Next, a configuration of a solid-state imaging device according to a fifth embodiment will be described. FIG. 26A is a plane view illustrating a color array of pixels in the solid-state imaging device according to the fifth embodiment, and FIG. 26B is a plan view illustrating a color filter array.

In the present embodiment, a white pixel 2W is disposed in addition to the pixels 2R, 2G, and 2B of the three colors. As illustrated in FIG. 26A, the white pixels 2W are arranged at intervals of pixels in each row and column, and the pixels 2R, 2G, and 2B of the three colors are arranged between the white pixels 2W. A ratio of the pixels 2R, 2G, and 2B of the three colors is 1:2:1 (=red:green:blue), similarly to the Bayer array. The green pixels 2G are arranged on every fourth pixel in each row and column, and the red pixels 2R and the blue pixels 2B are arranged on every fourth pixel in every other row and column. Unlike the above-described embodiments, the green pixel 2G is adjacent to the red pixel 2R or the blue pixel 2B only at the corner.

A color filter is not disposed for the white pixel 2W. Further, since the white pixel 2W is higher in sensitivity than the pixels 2R, 2G, and 2B of the three colors, a color filter having the same color as a color (any one of red, green, and blue) of the adjacent pixel is buried in the trench around the white pixel 2W. In other words, this configuration satisfies the above-mentioned layout rule "when there is a significant difference in the color sensitivity between adjacent pixels, a color filter having the same color as a color of a pixel having low sensitivity is buried in a trench between pixels."

As illustrated in FIG. 26B, a color filter is not disposed at a position 33 of the white pixel 2W that is hatched. Further, a color filter (any one of 30R, 30G, and 30B) of an adjacent pixel is buried in the trench around the white pixel 2W. In the color array according to the present embodiment, since the green pixels 2G are obliquely consecutive to one another, the green color filters 30G are consecutively formed. In FIG. 26B, the red color filter 30R and the blue color filter 30B are buried on the green pixel 2G and in the trench at the corner between the red pixel 2R and the blue pixel 2B. Since the corner of the pixel is smaller in leakage light than the periphery of the pixel, it is not problematic that the green color filter 30G is buried in the trench at the corner around the green pixel 2G.

In the arrangement illustrated in FIGS. 26A and 26B, the white pixels 2W are arranged not to be adjacent to each other vertically or horizontally, but when the white pixels 2W are arranged to be adjacent to each other vertically or horizontally, it is not problematic that no color filter is buried in a trench between the adjacent white pixels 2W.

The remaining configuration is the same as in the first embodiment, and the configuration illustrated in the plane view of FIG. 1 may be employed.

According to the above embodiment, the color filters 30R, 30G, and 30B are buried in the trench between the pixels. Thus, through the color filters 30R, 30G, and 30B in the trench, light can be prevented from filtering into the adjacent pixel, and the occurrence of the color mixture can be suppressed. Further, since a light blocking material such as a metal is not used in the trench, loss of sensitivity caused by reflection or absorption can be suppressed. Accordingly, the sensitivity can be improved while suppressing the color mixture.

Further, the color filter 30R, 30G, or 30B having the same color as a color of another pixel is buried in the trench between the pixels in which the white pixel 2W is adjacent to another pixel 2R, 2G, or 2B. As a result, light can be prevented from filtering from the white pixel 2W having the highest sensitivity to another pixel 2R, 2G, or 2B, and thus the occurrence of the color mixture can be suppressed. Further, the red color filter 30R is buried in the trench between the pixels in which the green pixel 2G is adjacent to the red pixel 2R, and the blue color filter 30B is buried in the trench between the pixels in which the green pixel 2G is adjacent to the blue pixel 2B. As a result, green light can be prevented from filtering from the green pixel 2G having the highest sensitivity to the red pixel 2R or the blue pixel 2B adjacent thereto, and the occurrence of the hem floating caused by the color mixture can be suppressed.

<6. Sixth Embodiment (Solid-state Imaging Device)>

Next, a configuration of a solid-state imaging device according to a sixth embodiment will be described. FIG. 27A is a plane view illustrating a color array of pixels in the solid-state imaging device according to the sixth embodiment, and FIG. 27B is a plan view illustrating a color filter array. In the present embodiment, the pixels 2R, 2G, and 2B of the three colors are arranged such that four pixels having the same color are consecutively arranged by arranging two pixels vertically and two pixels horizontally. When the consecutive four pixels having the same color are consolidated into one, it becomes similar to the Bayer array illustrated in FIG. 3A.

As illustrated in FIG. 27B, in the trench between the pixels in which the pixels having the same color are adjacent to each other, the color filter 30R, 30G, or 30B of the corresponding color is buried. The red color filter 30R or the blue color filter 30B is buried at the position at which the green pixel 2G is adjacent to the red pixel 2R or the blue pixel 2B. Thus, the configuration according to the present embodiment also satisfies the above-mentioned layout rule "when there is a significant difference in the color sensitivity between adjacent pixels, a color filter having the same color as a color of a pixel having low sensitivity is buried in a trench between pixels."

According to the configuration of the solid-state imaging device of the above-described embodiment, the color filter 30R, 30G, or 30B is buried in the trench between the pixels. Thus, through the color filters 30R, 30G, and 30B in the trench, light can be prevented from filtering into the adjacent pixel, and the occurrence of the color mixture can be suppressed. Further, since a light blocking material such as a metal is not used in the trench, loss of sensitivity caused by reflection or absorption can be suppressed. Accordingly, the sensitivity can be improved while suppressing the color mixture.

Further, the red color filter 30R is buried in the trench between the pixels in which the green pixel 2G is adjacent to the red pixel 2R, and the blue color filter 30B is buried in the trench between the pixels in which the green pixel 2G is adjacent to the blue pixel 2B. As a result, green light can be prevented from filtering from the green pixel 2G having the highest sensitivity to the red pixel 2R or the blue pixel 2B adjacent thereto, and the occurrence of the hem floating caused by the color mixture can be suppressed.

<7. Modified Example of Solid-state Imaging Device>

Among the above embodiments, in the color filter layouts illustrated in FIGS. 3, 24, 26, and 27, the blue color filter 30B is buried in the trench 27 at the corner between the red pixel 2R and the blue pixel 2B. However, the red color filter 30R may be buried in the trench 27 at the corner between the red pixel 2R and the blue pixel 2B. When the red color filter 30R is buried in the trench 27 at the corner, the red color filter 30R may be formed before the blue color filter 30B in the process of manufacturing the solid-state imaging device.

Figure 28:
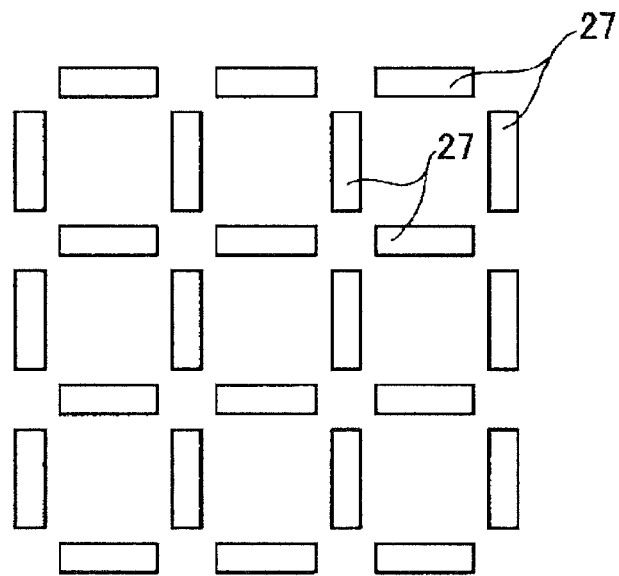
FIG. 28 is a plan view illustrating a modified example of a trench forming position.

In the above embodiments, as illustrated in FIG. 3B, the trenches 27 in which the color filter is buried are formed in the form of a lattice around the pixels. In the present technology, the trench 27 in which the color filter is buried is preferably formed in a large part of a region between the adjacent pixels. For example, as illustrated in a plane view of FIG. 28, the trench 27 in which the color filter is buried may be formed in the form of an island in a portion excluding the corner between the adjacent pixels.

The above embodiments have been described in connection with the example in which only one color filter is buried in the trench 27 between the pixels. In the present technology, color filters of two or more colors may be buried in the trench. At this time, it is preferable that at least a color filter having low sensitivity be buried in a trench between a pixel having a color of high sensitivity and a pixel having another color of low sensitivity. Further, as described above, a color filter may be configured to have a hollow portion thereinside.

The above embodiments have been described in connection with the example in which pixels of three colors of red, green, and blue and white pixels are used. In the present technology, a color of a color filter is not limited to red, green, and blue, and a combination of other colors may be employed. In the case of a combination of other colors, as long as the configuration satisfies the above-mentioned layout rule "when there is a significant difference in the color sensitivity between adjacent pixels, a color filter having the same color as a color of a pixel having low sensitivity is buried in a trench between pixels," the occurrence of the hem floating caused by the color mixture can be suppressed.

In the manufacturing processes according to the first and second embodiments, the green color filter 30G having the highest sensitivity is formed after the color filters 30R, 30G, and 30B of the three colors. In the case of a combination of other colors, preferably, in the process of forming a color filter in the manufacturing process of the solid-state imaging device, among color filters of two or more colors, a color filter having a color of the highest sensitivity is similarly formed after the color filters of the respective colors.

In the configuration of the fifth embodiment using the white pixel, the white pixel has the highest sensitivity, and the green pixel has the next highest sensitivity. As described above, when sensitivities of pixels of respective colors are classified into three or more levels, the color filter layout can be set based on the above-described layout rule according to each level of sensitivity of a pixel. However, in the present technology, when sensitivities of pixels of respective colors are classified into three or more levels, the layout rule do not necessarily have to be employed in all levels of sensitivity of a pixel. There is an effect by which the occurrence of the hem floating caused by the color mixture is suppressed when at least a color filter of any other color is buried in a trench between a pixel having a color of the highest sensitivity and an adjacent pixel having a color of another color.

For example, the solid-state imaging device according to the embodiment of the present technology can be applied to various kinds of electronic devices such as a camera system including a digital camera or a video camera, a mobile telephone having an imaging function, and another device having an imaging function.

<8. Seventh Embodiment (Electronic Device)>

Figure 29:
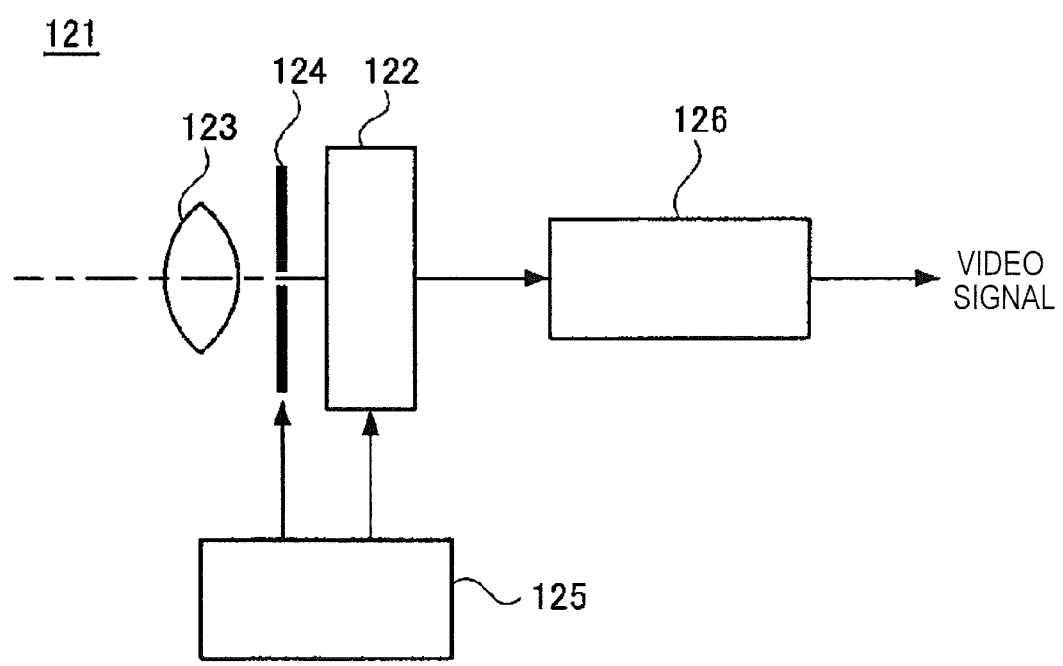
FIG. 29 is a schematic configuration diagram (block diagram) illustrating an electronic device according to a seventh embodiment.

FIG. 29 is a schematic configuration diagram (block diagram) illustrating an electronic device according to a seventh embodiment. As illustrated in FIG. 29, an electronic device 121 includes a solid-state imaging device 122, an optical system 123, a shutter device 124, a driving circuit 125, and a signal processing circuit 126.

The optical system 123 is configured with an optical lens or the like, and causes image light (incident light) from a subject to be formed on the pixel unit of the solid-state imaging device 122. As a result, signal charges are accumulated in the solid-state imaging device 122 during a predetermined period of time. The optical system 123 may include an optical lens system configured from a plurality of optical lenses. The solid-state imaging device according to the embodiment of the present technology such as the solid-state imaging devices according to the above embodiments is used as the solid-state imaging device 122. The shutter device 124 controls a light illumination period of time and a light blocking period of time on the solid-state imaging device 122. The driving circuit 125 supplies a driving signal used to control a transfer operation of the solid-state imaging device 122 and a shutter operation of the shutter device 124. Signal transfer of the solid-state imaging device 122 is performed in response to the driving signal (timing signal) supplied from the driving circuit 125. The signal processing circuit 126 performs various kinds of signal processing. A video signal that has been subjected to the signal processing is stored in a storage medium such as a memory or output to a monitor.

According to the configuration of the electronic device 121 according to the present embodiment, the solid-state imaging device according to the embodiment of the present technology such as the solid-state imaging devices according to the above embodiments is used as the solid-state imaging device 122, and thus in the solid-state imaging device, the sensitivity can be improved while suppressing the color mixture.

In the present technology, the configuration of the imaging device is not limited to the configuration illustrated in FIG. 29, and a configuration other than the configuration illustrated in FIG. 29 can be used as long as the configuration uses the solid-state imaging device according to the embodiment of the present technology.

Additionally, the present technology may also be configured below.

(1) A solid-state imaging device including:
 a semiconductor substrate;
 pixels each including a photoelectric conversion unit formed in the semiconductor substrate;
 a trench that is formed in the semiconductor substrate and separates the pixels that are adjacent; and
 a color filter that is formed above the photoelectric conversion unit of each of the pixels and buried in at least a part of the trench.

(2) The solid-state imaging device according to (1),
 wherein a color filter of another color is buried in the trench between a pixel having a color of highest sensitivity and an adjacent pixel having the other color.

(3) The solid-state imaging device according to (1),
 wherein a color filter having a color of low sensitivity is buried in the trench between pixels when there is a significant difference in color sensitivity between adjacent pixels.

(4) The solid-state imaging device according to (2),
 wherein a color array of pixels is a Bayer array, and a red color filter or a blue color filter having a color of an adjacent pixel is buried in the trench around a green pixel.

(5) The solid-state imaging device according to (2),
 wherein a color array of pixels is a clear bit array, a green color filter is buried in a trench between pixels adjacent to a green pixel, and a red color filter or a blue color filter having a color of a pixel adjacent to the green pixel is buried in a trench between pixels that is not adjacent to the green pixel.

(6) The solid-state imaging device according to (2) or (3),
 wherein a color array of pixels includes a white pixel on which a color filter is not disposed, and a color filter having a color of a pixel adjacent to the white pixel is buried in a trench between pixels that is not adjacent to the white pixel.

(7) The solid-state imaging device according to (2),
 wherein a color filter having an identical color is buried in a trench between pixels in which pixels having an identical color are adjacent to each other.

(8) A method of manufacturing a solid-state imaging device, including:
 forming a photoelectric conversion unit included in pixels in a semiconductor substrate;
 forming a trench separating the pixels that are adjacent in the semiconductor substrate; and
 forming a color filter above the photoelectric conversion unit of each of the pixels, and burying the color filter in at least a part of the trench.
(9) The method of manufacturing the solid-state imaging device according to (8), wherein the forming the color filter includes forming a color filter having a color of highest sensitivity among color filters of a plurality of colors after the color filters of the respective colors are formed.
(10) An electronic device including:
 an optical system;
 the solid-state imaging device according to any one of (1) to (7); and
 a signal processing circuit that processes an output signal of the solid-state imaging device.

The present technology is not limited to the above embodiments, and various configurations can be employed in the scope not departing from the gist of the present technology.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-156899 filed in the Japan Patent Office on Jul. 12, 2012, the entire content of which is hereby incorporated by reference.

What is claimed is:

1. A solid-state imaging device comprising:
 a semiconductor substrate;
 pixels each including a photoelectric conversion unit formed in the semiconductor substrate;
 a trench that is formed in the semiconductor substrate and separates the pixels that are adjacent; and
 a color filter that is formed above the photoelectric conversion unit of each of the pixels and buried in at least a part of the trench,
 wherein a color filter of another color is buried in the trench between a pixel having a color of highest sensitivity and an adjacent pixel having the other color.

2. The solid-state imaging device according to claim 1,
 wherein the color filter of another color has a color of low sensitivity.

3. The solid-state imaging device according to claim 1,
 wherein a color array of pixels is a Bayer array, and a red color filter or a blue color filter having a color of an adjacent pixel is buried in the trench around a green pixel.

4. The solid-state imaging device according to claim 1,
 wherein a color array of pixels is a clear bit array, a green color filter is buried in a trench between pixels adjacent to a green pixel, and a red color filter or a blue color filter having a color of a pixel adjacent to the green pixel is buried in a trench between pixels that is not adjacent to the green pixel.

5. The solid-state imaging device according to claim 1,
 wherein a color array of pixels includes a white pixel on which a color filter is not disposed, and a color filter having a color of a pixel adjacent to the white pixel is buried in a trench between pixels that is not adjacent to the white pixel.

6. The solid-state imaging device according to claim 1,
 wherein a color filter having an identical color is buried in a trench between pixels in which pixels having an identical color are adjacent to each other.

7. A method of manufacturing a solid-state imaging device, comprising:
 forming a photoelectric conversion unit included in pixels in a semiconductor substrate;
 forming a trench separating the pixels that are adjacent in the semiconductor substrate; and
 forming a color filter above the photoelectric conversion unit of each of the pixels, and burying the color filter in at least a part of the trench, wherein a color filter of another color is buried in the trench between a pixel having a color of highest sensitivity and an adjacent pixel having the other color.

8. The method of manufacturing the solid-state imaging device according to claim 7,
 wherein the forming the color filter includes forming a color filter having a color of highest sensitivity among color filters of a plurality of colors after the color filters of the respective colors are formed.

9. The method of manufacturing the solid-state imaging device according to claim 7, wherein the color filter of another color has a color of low sensitivity.

10. The method of manufacturing the solid-state imaging device according to claim 7,
 wherein a color array of pixels is a Bayer array, and a red color filter or a blue color filter having a color of an adjacent pixel is buried in the trench around a green pixel.

11. The method of manufacturing the solid-state imaging device according to claim 7,
 wherein a color array of pixels is a clear bit array, a green color filter is buried in a trench between pixels adjacent to a green pixel, and a red color filter or a blue color filter having a color of a pixel adjacent to the green pixel is buried in a trench between pixels that is not adjacent to the green pixel.

12. The method of manufacturing the solid-state imaging device according to claim 7,
 wherein a color array of pixels includes a white pixel on which a color filter is not disposed, and a color filter having a color of a pixel adjacent to the white pixel is buried in a trench between pixels that is not adjacent to the white pixel.

13. The method of manufacturing the solid-state imaging device according to claim 7,
 wherein a color filter having an identical color is buried in a trench between pixels in which pixels having an identical color are adjacent to each other.

14. An electronic device comprising:
 an optical system;
 a solid-state imaging device including a semiconductor substrate, pixels each including a photoelectric conversion unit formed in the semiconductor substrate, a trench that is formed in the semiconductor substrate and separates the pixels that are adjacent, and a color filter that is formed above the photoelectric conversion unit of each of the pixels and buried in at least a part of the trench, wherein a color filter of another color is buried in the trench between a pixel having a color of highest sensitivity and an adjacent pixel having the other color; and
 a signal processing circuit that processes an output signal of the solid-state imaging device.

15. The electronic device according to claim 14, wherein the color filter of another color has a color of low sensitivity.

16. The electronic device according to claim 14, wherein a color array of pixels is a Bayer array, and a red color filter or a blue color filter having a color of an adjacent pixel is buried in the trench around a green pixel.

17. The electronic device according to claim 14, wherein a color array of pixels is a clear bit array, a green color filter is buried in a trench between pixels adjacent to a green pixel, and a red color filter or a blue color filter having a color of a pixel adjacent to the green pixel is buried in a trench between pixels that is not adjacent to the green pixel.

18. The electronic device according to claim 14, wherein a color array of pixels includes a white pixel on which a color filter is not disposed, and a color filter having a color of a pixel adjacent to the white pixel is buried in a trench between pixels that is not adjacent to the white pixel.

19. The electronic device according to claim 14, wherein a color filter having an identical color is buried in a trench between pixels in which pixels having an identical color are adjacent to each other.

* * * * *